(12) United States Patent
Fumitake

(10) Patent No.: US 8,871,583 B2
(45) Date of Patent: Oct. 28, 2014

(54) SEMICONDUCTOR DEVICE AND MANUFACTURING METHOD THEREOF

(71) Applicants: Semiconductor Manufacturing International Corporation, Shanghai (CN); Semiconductor Manufacturing International Corporation, Beijing (CN)

(72) Inventor: Mieno Fumitake, Shanghai (CN)

(73) Assignees: Semiconductor Manufacturing International (Shanghai) Corporation (CN); Semiconductor Manufacturing International (Beijing) Corporation (CN)

( * ) Notice: Subject to any disclaimer, the term of this patent is extended or adjusted under 35 U.S.C. 154(b) by 0 days.

(21) Appl. No.: 13/675,759

(22) Filed: Nov. 13, 2012

(65) Prior Publication Data

US 2013/0134485 A1 May 30, 2013

(30) Foreign Application Priority Data

Nov. 24, 2011 (CN) .......................... 2011 1 0376996

(51) Int. Cl.
| | |
|---|---|
| H01L 21/336 | (2006.01) |
| H01L 27/098 | (2006.01) |
| H01L 29/808 | (2006.01) |
| H01L 27/12 | (2006.01) |
| H01L 29/06 | (2006.01) |
| H01L 21/8232 | (2006.01) |
| H01L 29/10 | (2006.01) |
| H01L 29/66 | (2006.01) |

(52) U.S. Cl.
CPC ............ *H01L 29/808* (2013.01); *H01L 27/098* (2013.01); *H01L 27/1211* (2013.01); *H01L 29/0657* (2013.01); *H01L 21/8232* (2013.01); *H01L 29/1066* (2013.01); *H01L 29/66901* (2013.01)
USPC ........... 438/195; 438/217; 438/289; 438/188; 438/142; 438/259; 438/268; 438/589

(58) Field of Classification Search
USPC ......... 438/195, 188, 399, 137, 138, 285, 590, 438/152, 194, 282, 301, 217, 289, 276, 283, 438/287, 183, 926, 142, 135, 343
See application file for complete search history.

(56) References Cited

U.S. PATENT DOCUMENTS 8,518,781 B2 * 8/2013 Fumitake ...................... 438/282

* cited by examiner

*Primary Examiner* — Chuong A Luu
(74) *Attorney, Agent, or Firm* — Innovation Counsel LLP

(57) ABSTRACT

A non-planar JFET device having a thin fin structure is provided. A fin is formed projecting upwardly from or through a top surface of a substrate, where the fin has a first semiconductor layer portion formed from a first semiconductor material of a first conductivity type. The first semiconductor layer portion has a source region and a drain region, a channel region extending between the source region and the drain region. Two or more channel control regions are formed adjoining the channel region for generating charge depletion zones at and extending into the channel region for thereby controlling current conduction through the channel region. A gate is provided so as to adjoin and short together the at least two channel control regions from the outer sides of the channel control regions.

9 Claims, 23 Drawing Sheets

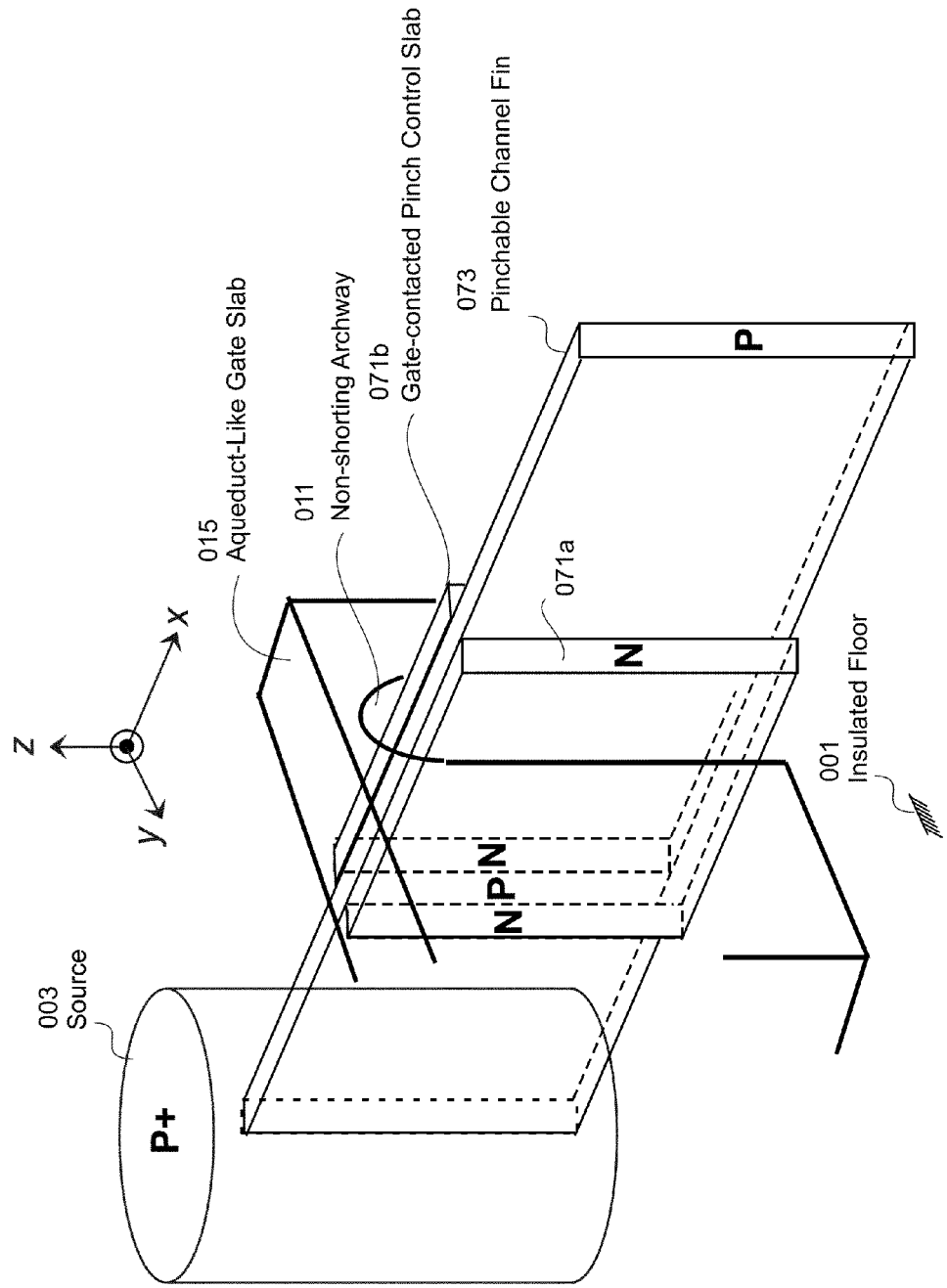

SEMICONDUCTOR DEVICE AND MANUFACTURING METHOD THEREOF

CROSS-REFERENCE TO RELATED APPLICATIONS

This application claims benefit of priority from Chinese Patent Application No. 201110376996.2, filed on Nov. 24, 2011 and entitled "Semiconductor Device and Manufacturing Method thereof", which application is incorporated herein by reference in its entirety.

FIELD OF DISCLOSURE

The present disclosure of invention relates to the field of semiconductor fabrication techniques, and more specifically, it relates to a semiconductor device and a manufacturing method thereof.

DESCRIPTION OF RELATED TECHNOLOGY

With continuous developments in the semiconductor technology sector, the critical dimensions of modern devices are continuously shrinking, for example to nanometer sized dimensions. Under such trends, a fin-containing semiconductor structure, such as found, for example in so-called, fin-based insulated gate transistors (for example, FinFETs) has been proposed. Currently, the fin-based insulated gate structured semiconductor device (Fin-IGFET) has been widely used in the field of memory and logic devices.

However, as such fin-based semiconductor device technology advances; the fabrication process has become more and more complex. Thus, it is being proposed that the junction-type JFET or the metal semiconductor (e.g., Schottky metal-semiconductor junction) type MESFET may eventually become an alternative for the IGFET (insulated gate) type MOSFET because of simpler fabrication process relative to that of the IGFET.

Therefore, in the future there will be a need for a manufacturable and small-sized fin-based JFET or fin-based MESFET structure as well as manufacturing method therefor. To this end, the present disclosure proposes a novel semiconductor device structure and a manufacturing method therefor.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

According to one aspect of the present disclosure of invention, there is provided a novel semiconductor device, comprising: one or more upwardly-projecting fins extending upwardly from a base substrate where each of the fins has a first semiconductor layer formed from a corresponding first semiconductor material, and where the first semiconductor layer has a source region portion; a drain region portion; a channel region interposed between the source region portion and the drain region portion, where the channel region is of a first conductivity type (e.g., lightly doped P− type); and where the source and drain region portions are also of the first conductivity type (e.g., heavily doped P+ type) and where the semiconductor device further comprises a channel control region adjoining the channel region and configured for controlling the channel region, the channel control region being at least formed in parts of surfaces of two sides of the first semiconductor layer along a channel direction of the channel region and adjoining at least parts of surfaces of two sides of the channel region along the channel direction, the channel control region having a second conductivity type (e.g., N) which is opposite to the first conductivity type. Where the semiconductor device further comprises a gate adjoining the channel control region from an outer side of the channel control region.

In an embodiment, the channel control region further comprises a portion formed above and adjoining the channel region.

In an embodiment, the fin further comprises a hard mask over the first semiconductor layer.

In an embodiment, the semiconductor device further comprises an insulating material layer formed over the substrate and surrounding the fin. In an embodiment, the insulating material layer has a thickness smaller than a height of the first semiconductor layer. In an embodiment, the channel control region is at least formed over outer surfaces of the two sides of the first semiconductor layer which surfaces are not covered by the insulating material layer, and the gate is formed above the insulating material layer.

In an embodiment, the channel region has a lower portion and an upper portion projecting upwards from the lower portion, and the lower portion is substantially lower than the upper surface of the insulating material layer. In an embodiment, the channel control region is formed above the lower portion and at least adjoins the upper portion at two sides of the upper portion along the channel direction.

In an embodiment, the channel has an inverted T-like shape.

In an embodiment, the gate is formed of a doped polysilicon or a doped amorphous silicon. In an embodiment, the gate is formed of a metal.

In an embodiment, the substrate further comprises an insulating layer below and adjoining the fin.

In an embodiment, the substrate further comprises a second semiconductor layer below and adjoining the fin, wherein the second semiconductor layer has a second channel control region for providing a corresponding third charge depletion zone, and the second channel control region has a conductivity type opposite to that of the channel region.

In an embodiment, the semiconductor device further comprises gate spacers located at two sides of the gate that neighbor the source region portion and the drain region portion, respectively.

In an embodiment, the source region port ion and the drain region portion have a same conductivity type as that of the channel region.

In an embodiment, the semiconductor device further comprises semiconductor material portions epitaxially grown from the source region portion and the drain region portion, where at least the respective semiconductor material portions epitaxially grown effectively constitute a source region and a drain region of a formed nonplanar JFET device.

In an embodiment, the substrate comprises two or more of the fins formed thereon, wherein the two or more the fins comprise a first fin and a second fin, the conductivity type of the channel region included in the first fin is same as or opposite to the conductivity type of the channel region included in the second fin.

According to another aspect of the present disclosure of invention, there is provided a method of manufacturing a semiconductor device, comprising: providing a substrate having a fin formed over a surface thereof, the fin having a first semiconductor layer formed of a semiconductor material having a first conductivity type; forming a dummy gate for the fin to enwrap a portion of the fin that corresponds to a channel region to be formed in the fin; forming a first insulating material layer over the substrate so as to at least cover the exposed portion of the fin and shaping the first insulating material layer so as to expose a top surface of the dummy gate; selectively removing the dummy gate to expose the portion of the first semiconductor layer that was enwrapped by the dummy gate; and introducing, into the exposed portion of the first semiconductor layer, one or more dopants including a dopant that is capable of imparting a second conductivity type, so as to thereby form a channel region of the first conductivity type and two or more channel controls region of the second conductivity type configured for generating corresponding charge depletion zones from opposed sides of the fin shaped channel and thus selectively controlling current flow through the channel region.

In an embodiment, the channel control regions further comprises a portion formed above and adjoining a top of the channel region.

In an embodiment, the fin further comprises a hard mask disposed over the first semiconductor layer portion.

In an embodiment, the method further comprises: after forming the dummy gate but before forming the first insulating material layer, forming spacers for the dummy gate, where the formed first insulating material layer also substantially covers the gate spacers.

In an embodiment, the method further comprises: after forming the gate spacers but before forming the first insulating material layer, epitaxially growing a semiconductor material from the exposed portion of the first semiconductor layer, and wherein the formed first insulating material layer also substantially covers the epitaxially grown semiconductor material.

In an embodiment, the method further comprises: after forming the spacers but before forming the first insulating material layer, introducing one or more dopants to form a source region and a drain region that adjoin the channel region, the source region and the drain region having a same conductivity type as that of the channel region.

In an embodiment, the method further comprises: after introducing the dopant(s), forming a gate for the fin, the gate adjoining the channel control regions from outer sides of the channel control regions.

In an embodiment, the method further comprises: after introducing the dopant(s) but before forming the gate, selectively removing the first insulating material layer.

In an embodiment, the method further comprises: after forming the gate, forming spacers for the gate.

In an embodiment, the method further comprises: after forming the gate spacers, epitaxially growing a semiconductor material from the exposed portion of the first semiconductor layer.

In an embodiment, the method further comprises: introducing one or more dopants to form a source region and a drain region that adjoin the channel region, the source region and the drain region having a same conductivity type as that of the channel region.

In an embodiment, the method further comprises: before forming a dummy gate, forming, over the substrate, a second insulating material layer that surrounds the fin, the second insulating material layer having a predetermined thickness smaller than a height of the first semiconductor layer such that the gate and the dummy gate can be formed above the second insulating material layer.

In an embodiment, the introducing of dopants includes introducing a type reversing dopant that is capable of imparting an opposed second conductivity type where this further results in the channel region having a lower portion and an upper portion projecting upwards from the lower portion, the lower portion being substantially lower than the upper surface of the insulating material layer, and the channel control regions being formed above the lower portion and at least respectively adjoining the upper portion at two opposed sides of the upper portion along a channel longitudinal direction.

In an embodiment, the forming of the second insulating material layer surrounding the fin comprises: forming a second insulating material over the substrate to cover the fin; and selectively removing part of the second insulating material so as to reach the predetermined thickness.

In an embodiment, the gate can be formed of a doped poly-silicon or a doped amorphous silicon. In an embodiment, the gate can be formed of a metal.

In an embodiment, the introducing of a dopant is performed by ion implantation, plasma treatment, or diffusion. In an embodiment, the introducing a dopant is performed by tilt ion implantation.

In an embodiment, the substrate further comprises an insulating layer below and adjoining the fin.

In an embodiment, the substrate further comprises a second semiconductor layer below and adjoining the fin, the second semiconductor layer having a second channel control region formed therein for providing thereat a respective third charge depletion zone, wherein the second channel control region has a conductivity type which is opposite to that of the channel region.

In an embodiment, the substrate comprises two or more of the fins formed thereon, the two or more of the fins comprise a first fin and a second fin, the conductivity type of the channel region included in the first fin is same as or opposite to the conductivity type of the channel region included in the second fin.

In an embodiment, the conductivity type of the channel region included in the first fin is opposite to the conductivity type of the channel region included in the second fin, and introducing the dopant further comprises: covering the first fin with a first mask and introducing a corresponding second dopant into the second fin; and removing the first mask; covering the second fin with a second mask and introducing a corresponding first dopant into the first fin.

In an embodiment, forming the first insulating material layer comprises: depositing a first insulating material over the substrate to cover the exposed portion of the fin and the dummy gate; and selectively removing a portion of the first insulating material to expose the upper surface of the dummy gate.

Further features of the present disclosure of invention and advantages thereof will become apparent from the following detailed description of exemplary embodiments according to the present invention with reference to the accompanying drawings.

BRIEF DESCRIPTION OF THE DRAWINGS

The accompanying drawings, which are incorporated in and constitute a part of the present disclosure of invention, illustrate exemplary embodiments, and, together with the specification, serve to explain the principles of the present disclosure of invention. In other words, the present disclosure of invention can be more clearly understood by reading the following detailed description with reference to the accompanying drawings, in which:

FIG. 1A is a schematic perspective view showing some concepts underlying a semiconductor device according to the present disclosure;

Figure 1B:
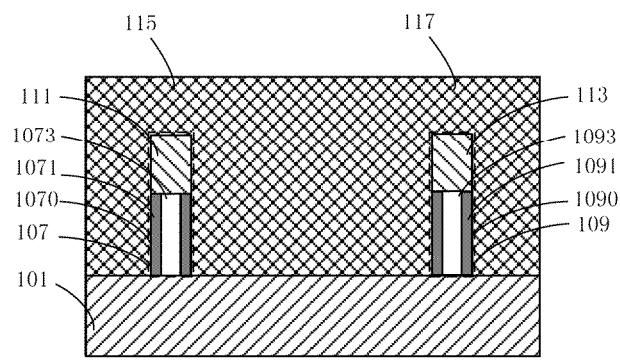
FIG. 1B is a schematic cross-sectional view showing a semiconductor device according to a first embodiment of the present disclosure.

It should be understood that the drawings are merely illustrative in nature and are not intended to limit the scope of the present invention. In the drawings, various components are not necessarily drawn to scale or according to their actual shapes, and some of the components (e.g., layers or parts) may be enlarged relative to others so as to more clearly explain the principles of the present invention. For simplicity and clarity, details of well-known features and techniques are not shown in the drawings to avoid unnecessarily obscuring.

DETAILED DESCRIPTION

In the below, embodiments in accordance with the present disclosure of invention will be described in conjunction with the accompanying drawings.

Referring to FIG. 1A, shown here in a perspective and primarily conceptual format is the makings of JFET type device that is capable of having the nanometer and below dimensions of modern IGFET type Fin devices but without the complexities of requiring an ultra-thin gate insulating layer between a gate slab 015 that extends longitudinally in a Y axis direction and a pinchable channel fin 073 that extends longitudinally in an X axis direction while rising up in a Z axis direction from an insulated floor layer 001.

As seen in FIG. 1A, and for sake of example, the pinchable channel fin 073 is a slab of semiconductive material having a P type conductivity and extending contiguously from an illustrated source region 003 of the same conductivity type (e.g., P+) and continuing to a drain region (not shown, for sake of illustrative clarity) also of the same conductivity type (e.g., P+). As those skilled in the art will appreciate from FIG. 1A, when the pinchable channel fin 073 is not pinched by sidewall depletion zones (not shown and to be explained shortly), majority charge carriers may flow from the alike type (e.g., P+) source region 003, through the pinchable channel fin 073 and into the contiguously attached drain region (not shown).

On the other hand, if reverse-biased PN junctions are created where the so-called, pinch-control slabs 071a and 071b contact the sidewalls of the pinchable channel fin 073, the charge-carrier depleted zones of these reverse-biased PN junctions (which are reversed due to appropriate biasing of the gate slab 015) extend from the sidewalls to substantially fill the otherwise conductive cross section of the pinchable channel fin 073, thus cutting off essentially all current flow from the source region 003, through the channel fin 073, and to the drain region (not shown). More specifically, the so-called, pinch-control slabs 071a and 071b are formed on the opposed sidewalls of the channel fin 073 where the pinch-control slabs 071a and 071b are made of a semiconductive or other appropriate material (e.g., Schottky metal) that can generate charge depletion zones when appropriately biased. Like the pinchable channel fin 073, the pinch-control slabs 071a and 071b extend longitudinally in the X-axis direction and they cover at least the full height of the pinchable channel fin 073 so as to be able to extend their generated charge depletion zones fully into the otherwise conductive cross section of the channel fin 073. The gate slab 015 is made of a conductive material (e.g., metal) and it shorts together the two pinch-control slabs 071a and 071b while not electrically connecting to the top surface of the pinchable channel fin 073. In the conceptual perspective diagram of FIG. 1A, the conductive gate slab 015 is shown to have a structure like an arched Roman aqueduct where the open archway 011 curves above the top surface of the channel fin 073 so as to not short thereto. It will be shortly understood that this conceptually empty archway 011 may instead, in a more practical device structure, be filled with an insulative filler or with a continuation of the two pinch-control slabs 071a and 071b, one to the other so that in combination they form an inverted U-shaped structure. These alternative possibilities are better depicted respectively in FIGS. 1B and 2 and will now be described in greater detail. For sake of completeness, it is to be noted that the extent of the incursion of the reverse bias depletion zones (not shown) into the pinchable channel fin 073 may be controlled by appropriate biasing of the gate 015 relative to at least one of the source (003) and drain such that the amount of conduction through the channel fin 073 may be modulated. In digital devices it is often desirable to have the device either turned substantially fully on or substantially fully off. In one embodiment, the two pinch-control slabs 071a and 071b may be composed of semiconductive material of conductivity (e.g., N) opposite to that (e.g., P−) of the channel fin 073.

FIG. 1B shows in cross section, a semiconductor device 100A according to a first embodiment of the present disclosure of invention. The semiconductor device 100A comprises a substrate (not completely shown) having a top layer 101 from which one or more channel fins (such as fins 107 and 109, as indicated by the white-filled rectangular blocks in FIG. 1B) project upwardly.

In some embodiments, the substrate (101) can be a bulk insulating substrate such as that of a Semiconductor-On- Insulator (SOI) device where the bulk insulative substrate material underlies the semiconductor material layer of the SOI substrate for forming active devices capable of high frequency operation. In other embodiments, the bulk substrate may be a semiconductive material and then an insulative layer 101 is formed at its top and where the pinchable fins (e.g., 107, 109) project upwardly from or through the insulative layer 101. In other words, the layer 101 can define an insulating layer below them and can adjoin the fins 107 and 109. However, it should be understood that, the present disclosure of invention is not only applicable to an SOI substrate, but also applicable to a case where fin is formed from a bulk semiconductor substrate (e.g. bulk single crystal silicon substrate), for example, as described below in conjunction with FIG. 3B. Thus, in some embodiments, the layer 101 can be representative of a semiconductor layer below and adjoin a fin, for example, a body of a semiconductor substrate.

In the device 100A of FIG. 1B, fin 107 has a semiconductor core 1070 (first conductivity semiconductor layer) formed of a semiconductor material. Fin 107 also has a hard mask 111 region formed over the first semiconductor layer 1070, as indicated by the hatched block in FIG. 1B disposed directly on top of the white-filled rectangle.

Figure 9A:
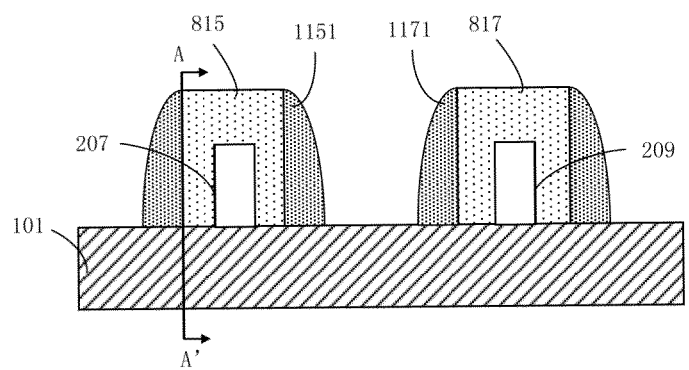
Figure 9B:
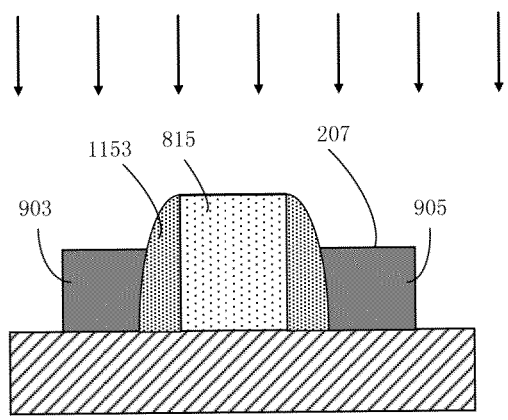

Although not shown in FIG. 1B, the first semiconductor layer 1070 of each pinchable fin is contiguous with a respective source region portion and a respective drain region portion (an example of a source portion being shown in FIG. 1A, and also indicated with one of 903 and 905 in FIG. 9B). The channel region 1073 is interposed between the source region portion and the drain region portion. The channel region 1073 can have a first conductivity type, for example, n-type or p-type. The channel region 1073 has a respective channel charge carrier conducting direction extending between the source region portion and the drain region portion. In an embodiment, the channel's charge carrier conducting direction can run along the length (longitudinal) direction of the fin 107 (e.g., a direction perpendicular to the paper plane in FIG. 1B). In some of the implementations, the channel region can be substantially located at the central portion of the semiconductor layer 1070 in the fin. However, it should be understood that such a configuration is merely illustrative and not for limiting the present teachings.

The semiconductor layer 1070 further comprises a pair of channel control regions 1071 adjoining sidewalls of the channel region and structured for controlling the turning-on and turning-off of conduction through the channel region 1073. In FIG. 1B, the channel control regions 1071 are shown as being formed at the two sidewalls of the semiconductor layer 1070 and extending along the channel's conduction direction. In other words, the channel region 1073 is sandwiched by the channel control regions 1071. However, the present disclosure of invention is not limited to this, and in other embodiments described hereunder, the channel control region not only adjoins the channel region 1073 at its two sidewalls, but also can adjoin the channel region at its top surface. That is to say, the channel control regions can further comprise a portion which is above and adjoining the top surface of the channel region. Thus, according to different embodiments of the present disclosure, the channel control regions can be at least formed as separate parts at the two sidewalls of the fin-shaped semiconductor layer or as a half-pipe structure having an inverted U-shape for a cross section and extending along the channel's longitudinal direction while adjoining with at least the two sidewalls of the channel region and optionally also with the top surface of the channel region 1073.

The channel control regions 1071 have a second conductivity type which is opposite to the conductivity type (the first conductivity type) of the channel region 1073, for example, p-type or n-type respectively corresponding to the n-type or p-type of the channel region.

In FIG. 1B, the case of where the fin has a hard mask formed therein is shown. However, the present teachings are not limited to this. As described in other embodiments below, the hard mask can be removed.

In addition, the semiconductor device 100A further comprises a gate 115 overlapping the fins 107, 109 and having a longitudinal extending direction orthogonal to that of the pinchable fins. The gate 115 adjoins the channel control regions 1071 from the outer sides of the channel control regions 1071. Although the gate 115 also covers the hard mask 111, where the latter is disposed over the channel control regions as illustrated in FIG. 1B, it should be understood that the gate 115 may have a double gate function, meaning that the gate 115 influences each of the pinchable fins at both of that fin's sidewalls.

In an embodiment, the gate 115 is formed of at least one of doped poly-silicon (N+ or P+ Si(p)), doped amorphous silicon (N+ or P+ Si(a)), or a metal material (e.g., a Schottky metal). In an embodiment, the channel control region has a relatively high concentration, for example, p+ or n+ type, for facilitating the formation of ohmic contact and thus reducing contact resistance.

As described above, the semiconductor layer 1070 can also have a source region portion and a drain region portion formed therein, which adjoin the channel region 1073. Since FIG. 1B is a sectional view of the fin, the source region portion and the drain region portion are not shown in the figure. It should also be understood that the source region portion and the drain region portion would have the same conductivity type as the channel region, that is, the first conductivity type.

The semiconductor device according to the present teachings can have one or more fins. For example, in addition to fin 107, there also can be a fin 109 the structure of which is substantially identical to that of the first described fin 107. The fin 109 has a semiconductor layer 1090 and a hard mask 113 over the semiconductor layer 1090.

The semiconductor layer 1090 has a respective source region portion and a drain region portion (not shown in the figure) and its channel region 1093 is disposed between the source region portion and the drain region portion. The channel region 1093 has a first conductivity type, for example, n-type or p-type. The channel region 1093 has a channel direction longitudinally extending between the source region portion and the drain region portion. In an embodiment, the channel direction of the channel region 1093 can run along the length direction of the fin 109 (e.g., a direction perpendicular to the paper plane in FIG. 1B). In some implementations, the channel region 1093 can be located substantially at the central portion of the semiconductor layer 1090 in the fin 109.

The semiconductor layer 1090 further has a pair of channel control regions 1091. As shown in FIG. 1B, the channel control regions 1091 are formed on the surfaces of the two sidewalls of the semiconductor layer 1090 along the channel direction of the channel region 1093 and they adjoin the surfaces of the two sidewalls of the channel region 1093 along the channel direction. However, the present teachings are not limited to this. In addition, the channel control regions 1091 have a conductivity type (i.e. second conductivity type) which is opposite to the conductivity type (the first conductivity type) of the channel region, for example, a p-type or n-type respectively corresponding to the n-type or p-type channel region.

Similarly, the semiconductor layer 1090 can further comprise a respective source region portion and a drain region portion that adjoin the channel region 1091.

The illustrated semiconductor device 100A of FIG. 1B may further comprise a second and separate gate 117 for the respective fin 109. The gate 117 adjoins the channel control region 1091 from the outer sides of the channel control region 1091 (the outer side of the channel control region 1091 relative to the channel region 1073).

Herein, the fin 107 can be referred to as the first fin and the fin 109 can be referred to as the second fin. Correspondingly, the components, such as, channel region, channel control region, hard mask, source region portion and drain region portion, gate, or the like, of or for the fins 107 and 109 can be distinguished by ordinal numbers like the first and the second.

Moreover, it should be understood that in the case where the fins 107 and 109 are initially formed, the fin 107 (the first fin) can have a conductivity type which is opposite to that of the fin 109 (the second fin). In other words, it is possible to make the channel region (channel) 1073 in fin 107 have a conductivity type which is opposite to that of the channel region 1093 in fin 109, and thus it is possible to integrally form an n-type (i.e. n-channel) junction field effect device (N-JFET) and a p-type (i.e. p-channel) junction field effect device (P-JFET) in the same semiconductor apparatus according to the present teachings.

Figure 2:
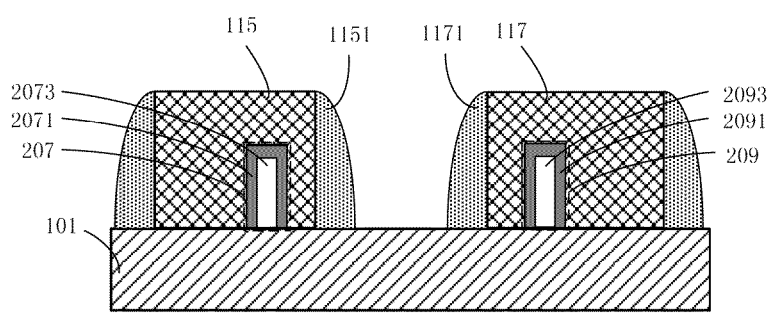
FIG. 2 is a schematic cross-sectional view showing a semiconductor device according to a second embodiment of the present disclosure.

In the illustrative embodiment of FIG. 1B, gates 115 and 117 are formed integrally and simultaneously, but this is not for limiting the present teachings. Depending on different situations to which the present teachings may be applied, gates 115 and 117 can be formed as two individual gates that are separated from one another, as shown in FIG. 2 for example. The present teachings can be applied to various different structural configurations.

Referring to FIG. 2, shown there is a semiconductor device 200A according to a second embodiment of the present disclosure, and in which fin 207 and fin 209 are shown. The device 200A differs from the semiconductor device 100A of the embodiment of FIG. 1B in that the hard masks in the fins are not present and channel control regions 2071 and 2091 have inverted U-shaped cross sections.

Fin 207 is formed of a semiconductor material, and thus it itself is a semiconductor layer. The fin 207 has a source region portion and a drain region portion (not shown in the figure) and the corresponding channel region 2073 is disposed between the source region portion and the drain region portion. The channel region 2073 has a first conductivity type, for example, n-type or p-type. The channel region 2073 has a channel direction extending between the drain region portion and the source region portion. In an embodiment, the channel direction of the channel region 2073 runs along the length direction of the fin (e.g., a direction perpendicular to the paper plane in FIG. 2). In some of the implementations, the channel region 2093 can be substantially located at the central portion of the fin 207.

Fin 207 further has a U-shaped channel control region 2071. As shown in FIG. 2, the channel control region 2071 is shown as not only being formed at the two sidewalls of fin 207 (the semiconductor layer) and along the channel direction of the channel region 2073 but also as further comprising a portion disposed over and adjoining the top of the channel region. That is, a channel control region 2071 of a U shape (an inverted U shape) is formed. The channel control region 2071 has a conductivity type (a second conductivity type) which is opposite to the conductivity type (the first conductivity type) of the channel region 2073, for example, a p-type or n-type respectively corresponding to the n-type or p-type channel region.

Similarly, fin 209 has a respective channel region 2093 and a U-shaped channel control region 2091. The structure of fin 209 is substantially identical to that of fin 207, but the conductivity types of the corresponding regions of these two fins can be the same or different depending on intended application. The channel control region 2091 can not only adjoin the channel region 2093 at the two sidewalls of the channel region 2093, but also adjoin the channel region on the top surface of the channel region.

In addition, separate gates 115 and 117 are shown in FIG. 2. Herein, the channel control region further comprises a portion over and adjoining the channel region. In an embodiment, even at this portion, the gate also adjoins the channel control region from the outer side of the channel control region (the outer side of the channel control region relative to the channel region, i.e., the upper side of the portion of the channel control region that is over the channel region).

Moreover, FIG. 2 also shows two respective pairs of containment sidewalls 1151 and 1171 corresponding to respective gates 115 and 117. As would be understood by those skilled in the art, since FIG. 2 is a sectional view of the fin, the containment sidewalls 1151 and 1171 shown in FIG. 2 are not necessarily provided around the source and drain portions of the respective JFET structures (where such other kinds of spacers will be shown in FIG. 9B with 1153), but instead are formed on outer walls of the respective gates 115 and 117 while other spacers are simultaneously formed elsewhere. The respective pairs of containment sidewalls 1151 and 1171 help prevent undesired shorting between the corresponding gates 115 and 117.

In addition, since the lateral dimension (width) of the fin may be relatively small (e.g. several angstroms (Å)) or even much smaller, as compared to the minimum dimension or critical dimension (CD) allowed by corresponding via (through hole) fabrication process; in some embodiments, the respective gates 115 and 117 may need to be extended asymmetrically relative to the pinchable fins so as to facilitate via connection. Such an asymmetric extension is shown in FIG. 2. However, the present disclosure of invention is not limited to this configuration.

Other features of the embodiment of FIG. 2 can be substantially identical to those of FIG. 1B, and thus detailed description thereof is omitted here.

Figure 3A:
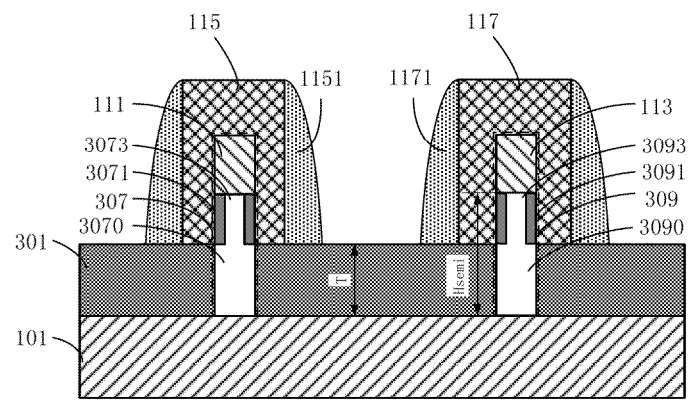
FIG. 3A is a schematic cross-sectional view showing a semiconductor device according to an embodiment of the present disclosure.

FIG. 3A shows a cross sectional view of a semiconductor device 300A according to another embodiment of the present disclosure. The semiconductor device 300A comprises a substrate (not completely shown) with a layer 101 above which fins 307 and 309 upwardly project (that is, upwardly relative to the underlying substrate).

In some embodiments, the layer 101 can be an insulating layer, such as the insulating layer in a Semiconductor-On-Insulator (SOI) substrate below the semiconductor material layer of the SOI substrate for forming the device. In other words, the layer 101 can be an insulating layer below the fin 307 and 309 and adjoining the fin 307 and 309.

The device 300A according to this embodiment can comprise one or more fins. The first fin 307 has a respective semiconductor layer 3070 formed of a semiconductor material and a hard mask 111 over the semiconductor layer 3070 as shown in FIG. 3A. The second fin 309 has a structure substantially identical to that of the first fin 307, which has a semiconductor layer 3090 formed of a semiconductor material and a hard mask 113 over the semiconductor layer 3090.

One difference between the device 300A of FIG. 3A and the device 100A of FIG. 1B is that an insulating material layer 301 is provided surrounding the lower portions of the fins 307 and 309. This additional insulating material layer 301 is formed over the substrate 101 in device 300A and functions to mechanically but insulatively support the fins. In an embodiment, as shown in FIG. 3A, the insulating material layer has a thickness smaller than the total height of the fin. In an embodiment, a ratio of the thickness T of the insulating material layer 301 to the difference between the full height Hsemi of the semiconductor layer 3070/3090 and the thickness T of the insulating material layer 301 is about 3-5, that is, T/(Hsemi−T)=3-5. However, it should be understood that the present disclosure of invention is not limited to this; larger or smaller ratios can be employed, so long as this insulating material layer 301 can provide support for the fins.

The semiconductor layer 3070 has a channel region 3073 and a pair of channel control regions 3071 for controlling the turning-on and turning-off of the channel region (channel). As shown in FIG. 3A, the channel control regions 3071 are at least formed on the two sidewalls of the semiconductor layer 3070 along the channel direction, where the sidewalls are not covered by the insulating material 301. The channel control regions 3071 are formed mainly above the upper surface of the insulating material layer 301, and the lower end of the channel control region 3071 can slightly extend downwards and into the upper surface of the insulating material layer adjacent thereto. This depends on the method used for forming the channel control regions (e.g. ion implantation, plasma treatment, diffusion, or the like) and corresponding process parameters (e.g. dosage, energy, plasma density and power, diffusion temperature and time, or the like) thereof.

The channel region 3073 can have a first conductivity type, for example, n-type or p-type. The channel region 3073 has a channel direction extending between the source region portion and the drain region portion. In an embodiment, the channel direction of the channel region 3073 can run along the length direction of the fin 307 (e.g., a direction perpendicular to the paper plane in FIG. 3A). The channel control regions 3071 have a second conductivity type which is opposite to the conductivity type (the first conductivity type) of the channel region 3073, for example, p-type or n-type respectively corresponding to the n-type or p-type channel region.

Herein, in an embodiment, the channel region 3073 has a lower portion and an upper portion projecting upwards from the lower portion, as shown in FIG. 3A. In an embodiment, the channel region 3073 can have an inverted T-like shape where the horizontal stem of the inverted T-like shape is rooted in the insulating material layer 301. In other words, the lower portion of the channel region 3073 is substantially below the upper surface of the insulating material layer 301. The channel control region 3071 is formed above the lower portion of the channel region 3073, and at least adjoins the upper portion at the two sides of the upper portion along the channel direction. In one embodiment, the lower portion of the channel region 3073 is undoped, in other words, intrinsic and does not easily conduct majority charge carriers. On the other hand, the upper portion of the channel region 3073 which is straddled by the channel control regions 3071 is doped and thus conductive when not selectively pinched by the depletion zones associated with the channel control regions 3071.

Besides, the semiconductor device 300A further comprises a gate 115 for fin 307. The gate 115 is formed over the insulating material layer 301. The gate 115 adjoins the channel control regions 3071 from the outer sides of the channel control region 3071 (i.e. the outer side of the channel control region relative to the channel region 3073). Likewise, the gate 115 herein can still be of a double-gate structure and function. In an embodiment, the gate can be formed of doped polysilicon, doped amorphous silicon, or metal material.

The semiconductor layer 3070 can further comprise a source region portion and a drain region portion that adjoin the channel region 3073. Since FIG. 3A is a sectional view of the fin, the source region portion and the drain region portion are not shown in the figure. It should be understood that, the source region portion and the drain region portion would have the same conductivity type as the channel region, that is, the first conductivity type.

The semiconductor layer 3090 has a channel region 3093 and a pair of channel control regions 3091 for controlling conduction through the channel region (channel). The structure of the semiconductor layer 3090 is substantially identical to that of the first described semiconductor layer 3070.

As shown in FIG. 3A, the channel control regions 3091 are formed at least in the surfaces of two sidewalls of the semiconductor layer 3090 along the channel direction which surfaces are not covered by the insulating material, and adjoins at least parts of the surfaces of the two sides of the channel region 3093 along the channel direction. It can be seen from FIG. 3A that the channel control regions 3091 can be formed mainly above the upper surface of the insulating material layer 301, and the lower end of the channel control region 3091 can slightly extend downwards and beyond (into) the upper surface of the insulating material layer adjacent thereto. However, the present teachings are not limited to this.

The channel region 3093 can have a first conductivity type, for example, n-type or p-type. In an embodiment, the channel direction of the channel region 3093 can run along the length direction of the fin 309 (e.g., a direction perpendicular to the paper plane in FIG. 3A). The channel control region 3091 has a conductivity type (second conductivity type) which is opposite to the conductivity type (the first conductivity type) of the channel region, for example, p-type or n-type respectively corresponding to the n-type or p-type channel region.

Similarly, the semiconductor device 300A further comprises a gate 117 for fin 309. Here, the gate 117 is formed above the insulating material layer 301. The gate 117 adjoins the channel control region 3091 from the outer sides of the channel control region 3091 (i.e. the outer side of the channel control region relative to the channel region 3093).

Similarly, the fin 309 further comprises a hard mask 113 formed over the semiconductor layer 3090, and the semiconductor layer 3090 can further comprise a source region portion and a drain region portion that adjoin the channel region 3093.

Herein, the fin 307 can be referred to as a first fin and the fin 309 can be referred to as a second fin. In addition, the channel region (channel) 3073 in the fin 307 can have a conductivity type which is opposite to that of the channel region 3093 in the fin 309, such that it is possible to form an n-type (i.e. n-channel) junction field effect device and a p-type (i.e. p-channel) junction field effect device in the semiconductor device according to the present disclosure of invention.

As described before, with respect to some of the earlier mentioned implementations, when; after the insulating material layer 301 is formed, respective one or more dopants are introduced by means of ion implantation, plasma treatment, and/or diffusion into the initially intrinsic fin structures to thus form the channel core 3073 and the oppositely doped channel control regions 3071 and 3091, parts of the doping impurities may become implanted or diffused into a portion of the semiconductor layer of the fin 307/309 below the upper surface of the insulating material layer 301. More specifically, it is within the contemplation of the disclosure that at least the dopants forming the channel control regions 3071 and 3091 extend below the upper surface of the insulating material layer 301. Accordingly the charge depletion zones may extend to pinch into the conductive part of the channel core 3073 even from underneath that core. This is also embraced within the scope of the present teachings.

Herein, such a case where the fin has a hard mask formed therein is shown, but the present teachings are not limited to this. As described in other embodiments hereunder, the hard mask can be omitted.

Figure 3B:
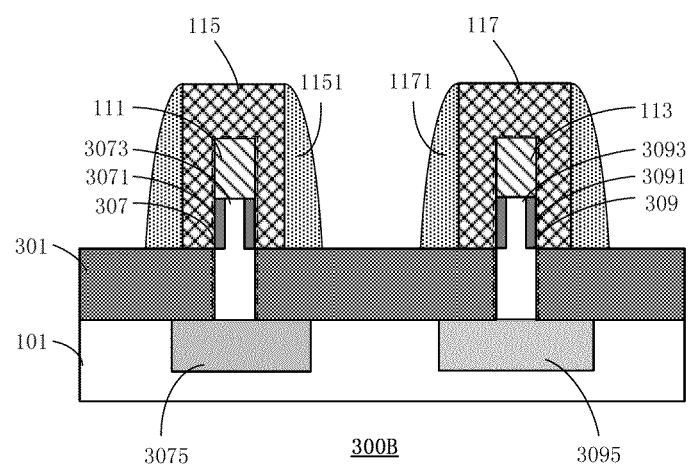
FIG. 3B is a schematic cross-sectional view showing a semiconductor device according to another embodiment of the present disclosure.

FIG. 3B shows a semiconductor device 300B according to another embodiment. The device 300B differs from the device 300A of FIG. 3A mainly in that a bulk semiconductor substrate (e.g. bulk silicon substrate) is used to initially form the fin in the device 300B. That is to say, the layer 101 in FIG. 3B represents a semiconductor layer below and adjoining the fin. In an embodiment, in such a case, a structure for providing a reverse bias (e.g. the first region 3075 and the second region 3095) is provided in the semiconductor layer 101.

In FIG. 3B, the layer 101 represents a semiconductor layer (second semiconductor layer) below and adjoining the fin. In an embodiment, in such a case, a second channel control region (3075, 3095) adjoining the channel region is formed in the semiconductor layer 101, so as to control the channel region. For example, through the second channel control region, a reverse bias can be provided between the channel region and the channel control region so that a corresponding charge depletion zone pinches into the core of the pinchable fin from underneath when selective pinching of the fin is desired.

In some implementations, the semiconductor layer 101 can have a conductivity type as same as that of the core channel region (e.g. 3073 or 3093) in the fin. In such a case, a region 3075 (the first region) having a conductivity type which is opposite to the conductivity type of the channel region 3073 can be provided in the semiconductor layer 101 and serves as the second channel control region. Likewise, a region 3095 (the second region) having a conductivity type which is opposite to the conductivity type of the channel region 3093 can be provided in the semiconductor layer 101 and serve as the second channel control region.

For example, when the channel region 3073 is of n type, the region 3075 can be of p type, or p+ type (i.e. p type with a high dopant concentration) in order to reduce contact resistance. Moreover, when the channel region 3093 is of p type, for example, the region 3095 can be of n type, or likewise, n+ type (i.e. an n type of a high dopant concentration) in order to reduce contact resistance. In some cases, the layer 101 as a whole can be used for providing a reverse bias, without separately providing the regions 3075 and 3095. In some of the implementations, the region 3075 and/or 3095 can be provided with a biasing voltage through an electrode (e.g. metal electrode, not shown) provided over a surface (backside) of the substrate that is opposite to the fin or through the surface of the substrate on which the fin is formed.

In addition, it should be understood that the reverse bias is defined in regard to the p-n junction formed between the channel region and the channel control region. Moreover, it should be understood that the structure for providing a reverse bias is not limited to the aforementioned examples. Other features of the embodiment of FIG. 3B can be substantially identical to those of FIG. 3A, and thus detailed description thereof is omitted.

Figure 4A:
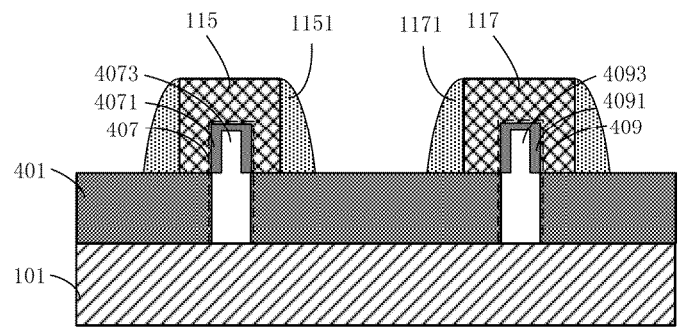
FIG. 4A is a schematic cross-sectional view showing a semiconductor device according to an embodiment of the present disclosure.
Figure 4B:
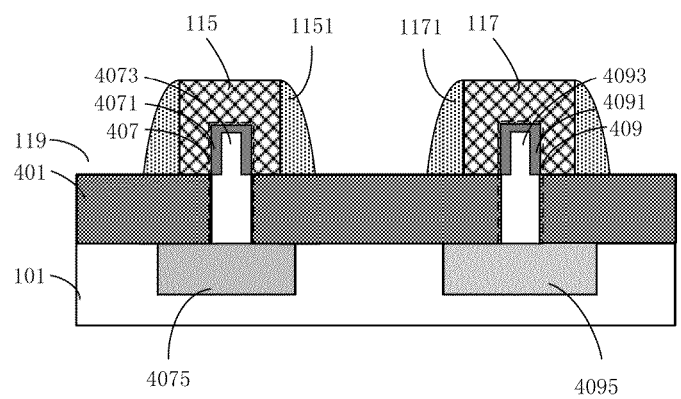
FIG. 4B is a schematic cross-sectional view showing a semiconductor device according to another embodiment of the present disclosure.

FIGS. 4A and 4B respectively show the semiconductor devices 400A and 400B according to additional embodiments in accordance with the present disclosure of invention.

The device 400A differs from the device 300A of FIG. 3A in that the hard masks 111 and 113 in the fins 307 and 309 are removed and that channel control regions 4071 and 4091 of a U shape (inverted U shape) are formed. That is, the channel control region (4071, 4091) is formed as not only including portions adjoining the channel region (4073, 4093) at the two sides of the channel region but also including a portion adjoining the channel region on the top of the channel region.

Herein, in an embodiment, the channel region 4073 has a lower portion and an upper portion projecting upwards from the lower portion, as shown in FIG. 4A. In an embodiment, the channel region 4073 can have an inverted T-like shape. The lower portion of the channel region 4073 is substantially below the upper surface of the insulating material layer 401. The channel control region 4071 is formed not only in the surfaces of the two sides of the semiconductor layer 4070 along the channel direction that are not covered by the insulating material and adjoining at least parts of the surfaces of the two sides of the channel region 3073 along the channel direction; but also further comprises a portion above and adjoining the channel region.

Other features of the embodiment of FIG. 4A are substantially identical to those of FIG. 3A, and thus detailed description thereof is omitted.

The device 400B differs from the device 400A of FIG. 4A in that a bulk semiconductor substrate (e.g. bulk silicon substrate) is used to form the fin in device 400B. That is, the layer 101 in FIG. 4B represents a semiconductor layer below and adjoining the fin. In such a case, in an embodiment, a structure (e.g. the first region 4075 and the second region 4095) for providing a reverse bias is provided in the semiconductor layer 101.

Descriptions on those similar structures and regions in FIG. 3B (for example, the first region 3075 and the second region 3095 shown in FIG. 3B) can be properly applied to the structures and/or regions described in this embodiment (the first region 4075 and the second region 4095 shown in FIG. 4B). Other features of the embodiment of FIG. 4B can be substantially identical to those of FIG. 4A, and thus detailed description thereof is omitted.

As will be better explained (in more detail) below, the semiconductor device (100A, 200A, 300A and 300B, 400A and 400B) according to the present disclosure can further comprise spacers 1153 (FIG. 9B), which can be located at the two sides of the gate that are adjacent to the source region portion and the drain region portion, respectively so as to keep the gate insulated from the source or drain.

In addition, although it is not shown in the figures, the semiconductor device can further comprise additional semiconductor material portions epitaxially grown from the source region portion and the drain region portion of the respective JFET device. In such a case, the source region portion and the drain region portion together with the semiconductor material portions epitaxially grown therefrom may be deemed as constituting the source region and the drain region, respectively. On the other hand, in the case where such epitaxial growth is not conducted, the source region portion and the drain region portion themselves respectively are source and drain regions of the JFET device. (Although not specifically shown in the drawings, it is within the contemplation of the present disclosure that the epitaxial growth in the source and drain portions and/or a herein described doping implant in the source and drain portions be for the purpose of forming relatively shallow source and/or drain regions such that current flow between the shallow source and/or drain regions is mostly through an upper portion of the pinchable fin channel.)

In the below, steps will be described for forming a substrate having a fin formed thereon according to the present disclosure and with reference to FIGS. 5A-5C, 6, 7A and 7B.

Figure 5A:
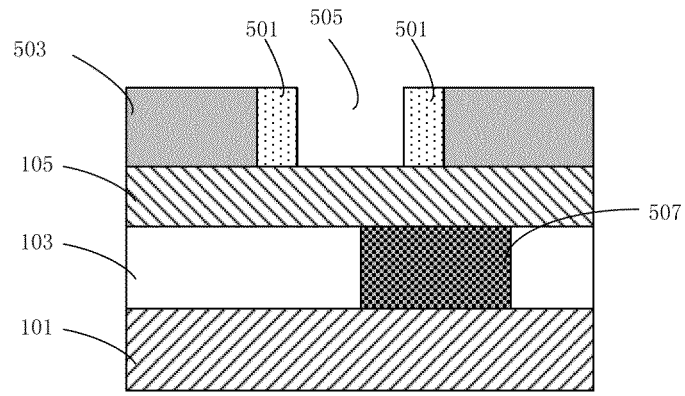
FIGS. 5A-5D and FIG. 6 are schematic cross-sectional views showing methods of manufacturing a fin according to some embodiments of the present disclosure.
Figure 5B:
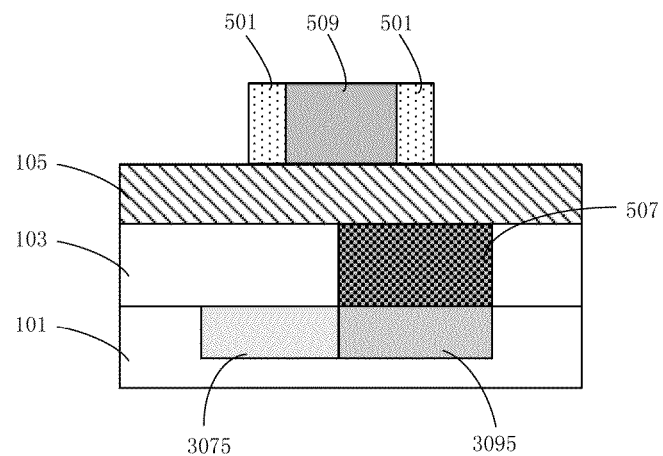
Figure 5C:
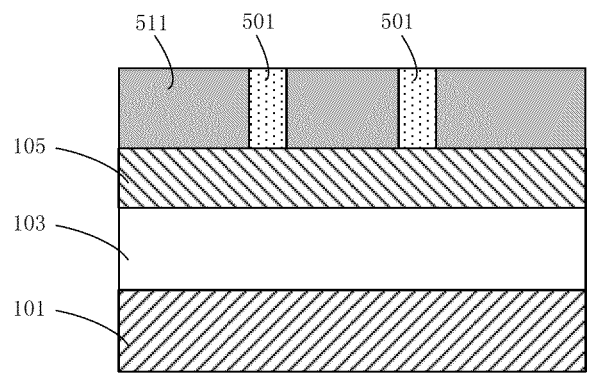

FIGS. 5A-5C are exemplary sectional views showing methods for forming a mask used for etching according to embodiments of the present disclosure.

FIG. 5A shows a situation where the mask is formed by a mandrel-spacer method. As shown in FIG. 5A, the wafer has an insulative base layer 101 and a semiconductor layer 103 disposed on the layer 101. As described before, the layer 101 can be the insulator layer in a SOI substrate or a body of a bulk semiconductor substrate. In the latter situation, the layer 103 and the layer 101 can be integrated as one layer, or to say, the layer 103 can be omitted; the layer 103 also can be a semiconductor layer different from the layer 101.

A hard mask layer 105 is formed over the wafer to cover the semiconductor layer 103.

Thereafter, a mandrel layer 503 is formed over the hard mask 105. The mandrel layer 503 can be formed for example of silicon oxide, poly-silicon, or the like. An opening is formed at a desirable position in the mandrel layer 503, as exemplarily shown in FIG. 5A. Then, spacers 501 are formed on the sidewalls of the opening. Thereafter, the mandrel layer 503 is selectively removed while the spacers (masking pillars) 501 are left behind to serve as a mask for a subsequent etching step that will form the fins as integrally extending below the left behind spacers (masking pillars) 501.

Next, using at tilted beam implantation method, a region 507 having a different conductivity type can be formed at a desirable position (for example, below the right-side spacer) in the layer 103. The region 507 can be used for forming a fin of different conductivity type. Alternatively, the opposed conductivity fin precursor 507 could have been formed before layer 105 and masking pillars 501 are formed.

FIG. 5B shows another method for forming the mask. A sacrificial pattern 509 is formed on the hard mask 105. Then, spacers 501 are formed on the sidewalls of the sacrificial pattern 509. Next, the sacrificial pattern 509 is selectively removed while the spacers 501 are left behind and remain to serve as a mask required for the etching for forming the fins.

Similarly, a region 507 having a different conductivity type can be formed at a desirable position (e.g. below the right-side spacer) in the layer 103. The region 507 can be used for forming a fin of different conductivity type. Moreover, the above-mentioned first region and the second region (3075, 3095, etc.) can be formed in the layer 101 that is a semiconductor layer.

FIG. 5C shows another method for forming the mask, in which a double patterning method such as one known in the art is employed, for example, a pattern or mask 501 can be formed in a resist 511 through double-exposure lithography. Thereafter, the undesired part in the resist 511 can be removed. In such a case, the pattern 501 can be baked before performing an etching with the mask, such that pattern 501 will be not easily collapse during the etching process.

Figure 5D:
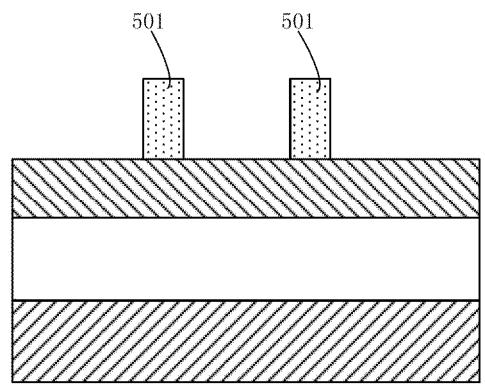
Figure 6:
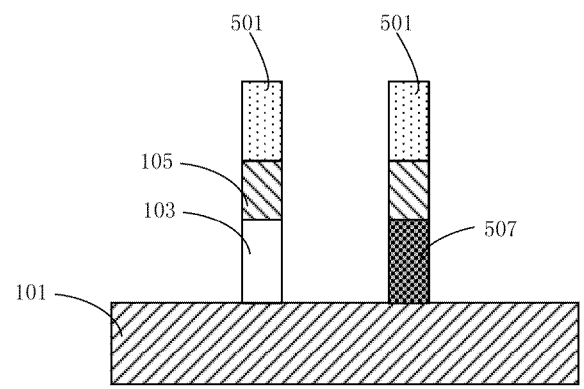

Thus, as shown in FIG. 5D, a patterned mask 501 used for etching is formed. Thereafter, the hard mask layer 105 and the semiconductor layer 103 (or 101) can be etched with use of the mask 501, thereby forming the fin(s), as shown in FIG. 6. As would be understood by those skilled in the art, the etching can be performed through multiple etch processes as appropriate, for example, the hard mask layer 105 and the semiconductor layer (the first semiconductor layer) are etched respectively with different processes. Or, the etching can be performed in an all-in-one manner using one and the same etching apparatus without removing the wafer from the etching apparatus during etching. Thereafter, the mask 501 is removed and in one embodiment, the hard mask layer is also selectively removed, thereby forming the fin(s) (e.g. 107, 109; 207, 209), as shown in FIGS. 7A (with hard mask removed) and 7B (with hard mask left intact).

Figure 7A:
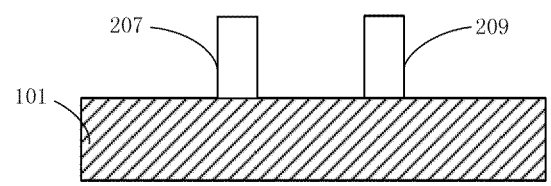
FIGS. 7A and 7B are schematic cross-sectional views showing a semiconductor substrate having a fin according to embodiments of the present disclosure.
Figure 7B:
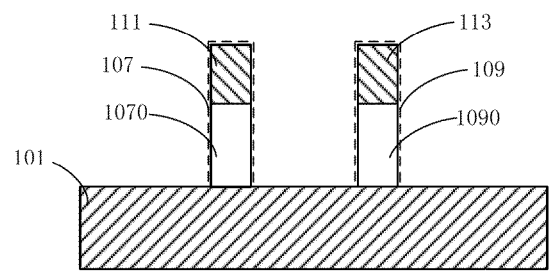

According to the present disclosure, and as shown in FIGS. 7A and 7B, a substrate with one or more fins (107, 109, 207, and 209) formed on a surface thereof is provided, wherein a fin may have a semiconductor layer (1070, 1090, 207 and 209) formed from a semiconductor material (e.g., monocrystalline Si or GeSi) having a first conductivity type. In some embodiments of the present invention, the fin can further comprise a hard mask (111, 113) over the semiconductor layer (1070, 1090). Herein, the first conductivity type can be n-type or p-type.

In the below, subsequent fabrication flows are described respectively for fins with a hard mask and fins without a hard mask, respectively.

Firstly, steps of the manufacturing method of a device according to one embodiment will be described with reference to FIGS. 7A, 8A, 8B, 9A, 9B, 10A, 10B, 11A, 11B, and 12-14B.

A substrate as shown in FIG. 7A is provided, with one or more fins 207 and 209 formed on a surface thereof. Herein, the fins themselves are semiconductor layers formed of a semiconductor material and having a first conductivity type.

Figure 8A:
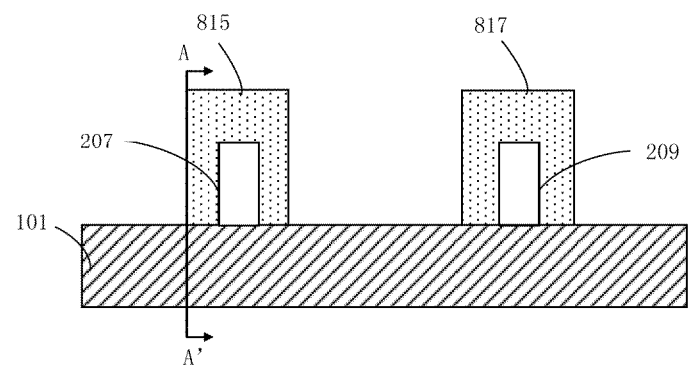
FIGS. 8A and 8B, 9A and 9B, 10A and 10B, 11A and 11B, 12, 13, 14A and 14B are schematic cross-sectional views showing the steps of a method of manufacturing a semiconductor device according to an embodiment of the present disclosure.
Figure 8B:
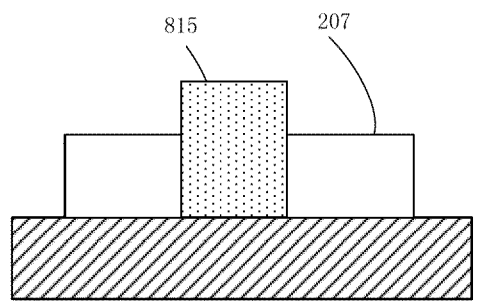

As shown in FIGS. 8A and 8B, dummy gates (sacrificial place holders) 815 and 817 corresponding to the respective fins 207 and 209 are respectively formed, to enwrap portions of the fins 207 and 209 that are corresponding to the channel regions to be formed. Herein, FIG. 8B is a sectional view taken along line A-A' of FIG. 8A and viewed along the direction indicated by the arrow so that the partial enwrapping aspect can be better seen.

In this embodiment, the fins 207 and 209 themselves are semiconductor layers (the first semiconductor layers), that is to say, the fins have no hard mask on their tops. In addition, although two fins are shown herein, it should be understood that, as described above, a semiconductor device of the present disclosure can comprise one or more fins. In addition, the various component structures of the device of the present invention are possible, and not limited to the situations described and illustrated in the figures of the present invention.

Moreover, it should be understood that only those main components or steps that are relevant to the present teachings are described in the specification, while other minor components or steps that are not concerned by the present invention are not described in detail. For example, before forming the dummy gate, native oxide on the fin can be removed, for example, by a wet process using a cleaning solution or a diluted hydrofluoric acid.

In some implementations of this embodiment, the step of forming the dummy gates 815 and 817 can comprise: forming a dummy gate material (e.g. poly-silicon) layer over the substrate having fins 207 and 209 formed thereon, to at least cover the fins; then, patterning to form dummy gates 815 and 817.

As shown in FIG. 8B, only a portion of the fin 207 (209) is covered by the dummy gate 815 (817), in which portion a channel region (fin core) will be correspondingly formed later.

Next, considering the reliability, in an embodiment, a spacer (1153 of FIG. 9B) for the dummy gate is formed as shown in FIGS. 9A and 9B. Here, FIG. 9B is a sectional view taken along line A-A' of FIG. 9A and viewed along the direction indicated by the arrow.

The spacers 1153 are formed on two sides of the dummy gate that are adjacent to the to-be-formed source region portion and the drain region portion (to be formed later), respectively. In addition, it should be understood that the sidewalls 1151 and 1171 shown in FIG. 9A are formed on other sides of the gate that are not adjacent to the source region portion and the drain region portion. Thus, these two are here below termed as spacer and sidewall respectively so as to be distinguished from one another. Although not directly shown by FIG. 9B, in one embodiment a top view for this cross sectional side view may appear as a capital H filed in its interior by white to represent the source, drain and pinchable fin extending contiguously there between, while a rectangle filled with wide-spaced dots represents the dummy gate (DG) and overlaps only the fin and while a rectangular frame filled with closely-spaced dots represents the combined spacers 1153 and sidewalls 1151 and frames around the rectangle representing the DG 815. Therefore in such a top view (not shown) the source and drain are exposed for doping by the implant step of FIG. 9B while the pinchable fin is protectively covered by the DG 815.

Here, spacer/sidewall can be formed of, for example, a silicon oxide, a silicon nitride, a silicon oxynitride, a silicon nitrogen oxide, or the like. However, the present teachings are not limited to this.

In an embodiment, after forming of the spacer, one or more ion implantations can be performed so as to form an appropriately doped source region portion 903 and an appropriately doped drain region portion 905 in the first semiconductor layer, as is indicates in FIG. 9B by the altered shadings of regions 903 and 905 (compared to 207 of FIG. 8B). However, it should be understood that the present invention is not limited to this. The source region portion 903 and the drain region portion 905 can have the same conductivity type as the channel region but the doping concentrations may be different (e.g., more heavily doped in contact making portions of the source and drain).

Alternatively, the source region port ion 903 and the drain region portion 905 can have the same conductivity type and same doping concentration as that of the channel region. As for the depths of the source region portion and the drain region portion, there is no specific limitation, so long as the source region portion and the drain region portion adjoin the channel region that is to be formed later. In an embodiment, the depths of the source region portion and the drain region portion can be substantially equal to the height of the semiconductor layer in the fin.

In an embodiment, after forming the spacer, a semiconductor layer having a certain thickness can be epitaxially grown for the exposed surface of the semiconductor layer. For example, a semiconductor layer having a thickness of tens of angstroms (Å) can be epitaxially grown. The thickness of the epitaxially grown semiconductor layer can be determined based on the width of the fin.

After the epitaxial growth, implantation can be performed to form a source region portion and a drain region portion. According to other implementations, the implantation can be performed prior to the epitaxial growth, and in-situ doping can be performed during the process of epitaxial growth. Thus, in such a case, the source region portion and the drain region portion together with the semiconductor material portions epitaxially growing therefrom constitute a source region and a drain region. In the case where the epitaxial growth is not carried out, the source region portion and the drain region portion themselves are the source region and the drain region of the to-be-finished JFET device, respectively.

Incidentally, although a gate-formed-last (and on top) approach is employed in the illustrated embodiments, it should be understood that these embodiments are merely exemplary and the present disclosure of invention is not limited to these exemplary embodiments. That is, spacers and source/drain can be not formed immediately after the formation of the dummy gate, according to some alternative embodiments. For example, spacers can be formed after the formation of the gate, and then source region portion and drain region portion can be formed.

Figure 10A:
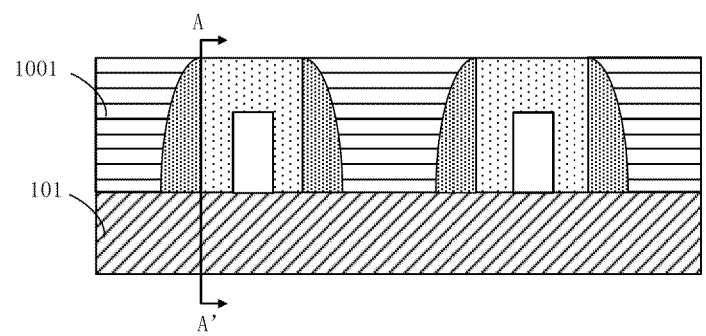
Figure 10B:
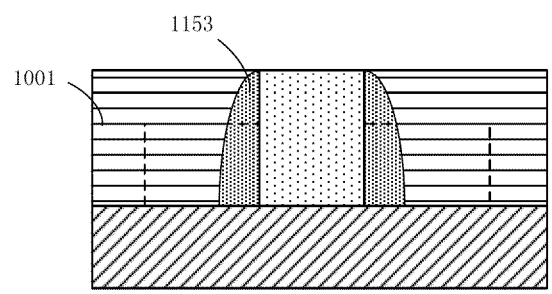

Thereafter, as shown in FIGS. 10A and 10B, a first insulating material layer 1001 is formed over the substrate, to at least cover the exposed portions of the fin. The first insulating material layer 1001 is formed to or polished back down to a height that exposes the top surfaces of the dummy gates. Here, FIG. 10B is a sectional view taken along line A-A' of FIG. 10A and viewed along the direction indicated by the arrow.

In some implementations, the first insulating material can be deposited to height above that of the dummy gates (and spacers, if present) as already been formed, so as to cover the entire substrate, that is, to cover the exposed portions of the fin and also of the dummy gates. Then, a part of the first insulating material is selectively removed by etch back and/or CMP so as to expose the upper surface of the dummy gate. For example, the step of removing can be performed by a chemical mechanical polishing (CMP) or selective etching-back to an end point where the upper surface of the first insulating material layer is planarized and is substantially flush with the upper surface of the dummy gate, thereby exposing the upper surface of the dummy gate. The first insulating material can be, for example, silicon oxide.

In the case where the aforementioned spacers 1153 are formed, the first insulating material layer preferably also covers the spacers.

In addition, since fins 207 and 209 are indicated with the dotted block in the figures since they are shielded.

Figure 11A:
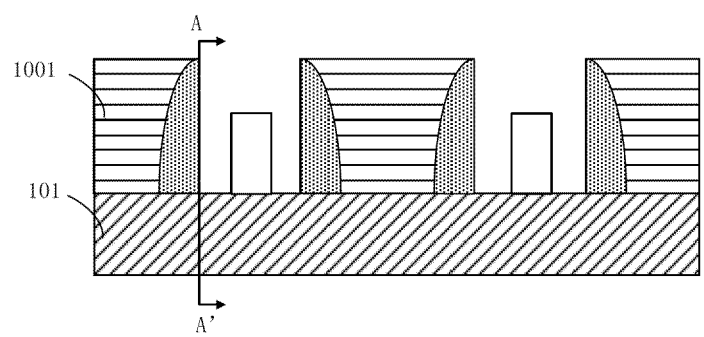
Figure 11B:
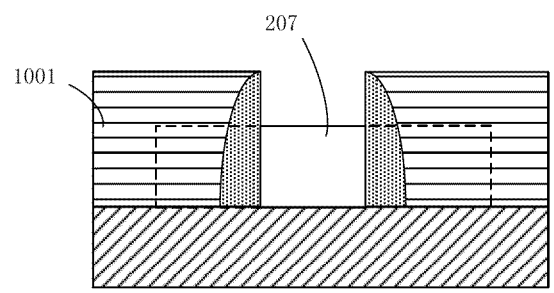

Next, as shown in FIGS. 11A and 11B, the sacrificial material of the dummy gates 815 and 817 is selectively removed. Herein, FIG. 11B is a sectional view taken along line A-A' of FIG. 11A and viewed along the direction indicated by the arrow. Thus, the portions of the fins 207 and 209 that were covered by the dummy gate are exposed. The dummy gate can be removed by a wet etching method or a dry etching method, for example. Although not directly shown by FIG. 11B, in one embodiment a top view for this cross sectional side view may appear as a capital H filed in its interior by white to represent the source, drain and pinchable fin extending contiguously there between, while a rectangular frame filled with closely-spaced dots represents the combined spacers 1153 and sidewalls 1151 and frames around an open rectangle from which the DG 815 has been removed to thus expose the fin. At the same time, first insulating material layer 1001 protectively covers the source and drain portions. Therefore in such a top view (not shown) the fin is exposed for doping by the implant step of FIG. 12 while the source and drain are protectively covered by the first insulating material layer 1001.

Figure 12:
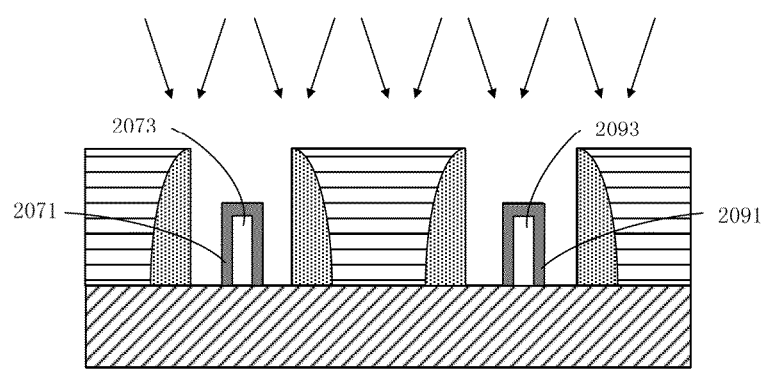

Then, as shown in FIG. 12, a dopant that can impart a second conductivity type opposite to the first conductivity type is introduced into the outer exposed surfaces of the fin (that is, the exposed portion of the semiconductor layer) by, for example, tilted ion implantation, plasma treatment, depth-limited diffusion, or the like. As such, channel regions 2073 and 2093 as well as channel control regions 2071 and 2091 for controlling the channel regions 2073 and 2093 are formed in the semiconductor layer. The channel regions 2073 and 2093 have the first conductivity type (e.g., n-type or p-type), while the channel control regions 2071 and 2091 have the second conductivity type (e.g. corresponding p-type or n-type) opposite to the first conductivity type. Moreover, channel control regions 2071 and 2091 are respectively formed to a desired depth below the exposed surface portions of the respective semiconductor layers 2070 and 2090 along the respective channel directions of the channel regions 2073 and 2093, and adjoin the surfaces of the two sides of the respective channel regions along the respective channel directions.

Herein, the channel regions 2073 and 2093 each have a lower portion and an upper portion projecting upwards from the lower portion. The lower portion is substantially below the upper surface of the insulating material layer 1001.

In this, here-described embodiment, the channel control regions 2071 and 2091 are formed as a U shape (an inverted U shape), and adjoin the channel regions 2073 and 2093 at the two sides of and at the top of the channel regions 2073 and 2093, respectively. That is, the channel control regions 2071 and 2091 each further comprise a portion above the channel region and adjoining the channel region. Herein, the channel regions 2073 and 2093 can have a reverse T-like shape.

Here, in an embodiment, ion implantation is preferably used for introducing the control portion forming dopant(s), and more preferably, a tilted ion implantation is used for introducing the dopant, in which, for example, the incident angle of the ions can be adjusted to be not perpendicular but rather inclined to the substrate surface.

In addition, in an embodiment, after the processing of ion implantation and the like, annealing (e.g., rapid thermal annealing) can be performed so as to repair damages caused by ion implantation to the crystalline microstructure of the pinchable fins.

In the case where fins 207 and 209 have different conductivity types, that is, in the case where the channel regions to be formed in fins 207 and 209, respectively, have different conductivity types (e.g., for forming complementary P and N JFETs), the step of introducing the respective dopants can further comprise, for example: forming a first mask (e.g., a resist) to cover one of fins 207 and 209 (e.g., first fin) while introducing a first dopant having a corresponding conductivity type into the other fin (e.g., second fin) which is exposed; then, removing the first mask, and forming a second mask to cover the other fin (e.g., the second fin) while exposing the one fin (e.g., the first fin); and, introducing a second dopant having a corresponding conductivity type into the one fin (e.g. the first fin) which is exposed.

Figure 13:
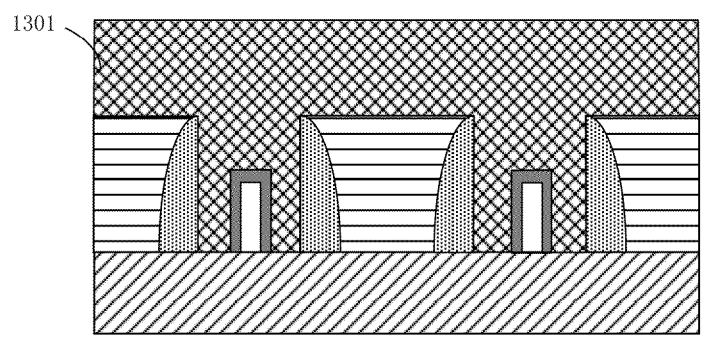
Figure 14A:
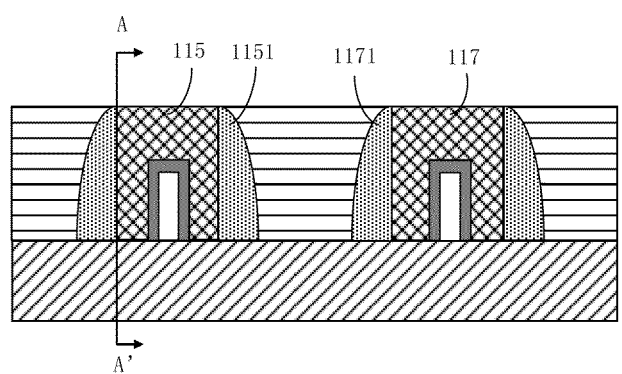
Figure 14B:
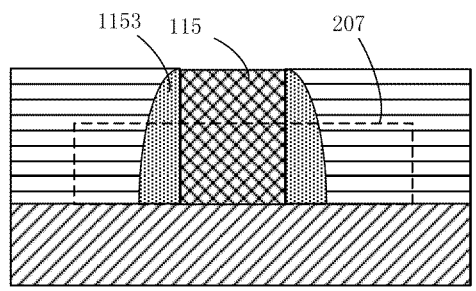

Thereafter, as shown in FIGS. 13, 14A and 14B, the material for gates 115 and 117 is deposited over where the fins are exposed in a manner whereby the gates will adjoin (short together) the channel control regions from the outer sides of the channel control regions. For example, in one implementation, a gate material layer 1301 can be formed onto the substrate, as shown in FIG. 13. According to different embodiments, the gate material can be composed of heavily doped poly-silicon, doped a-Si (amorphous silicon), a conductive metal material, or the like. Then, for example, chemical mechanical polishing is performed, until the upper surface of the first insulating material layer 1001 is exposed (as shown in FIGS. 14A-14B), or to say, until the planarized upper surface of the gate material layer is substantially flush with the planarized upper surface of the first insulating material layer 1001. Thus, gates 115 and 117 are formed, as shown in FIGS. 14A and 14B. Here, FIG. 14B is a sectional view taken along line A-A' of FIG. 14A and viewed along the direction indicated by the arrow. FIG. 14B more clearly shows the spacer 1153 used for isolating the gate 115 from the source and drain portion of the JFET device.

In the below, steps of the manufacturing method of a device according to one embodiment of the present invention are described with reference to FIGS. 15-17, 18A, 18B, 19A, 19B, 20A, 20B, 21 and 22.

In this embodiment, and as was the case in the immediately above description, the substrate is formed with fin(s) (as shown in FIG. 7A) having no hard mask, and an insulating material layer surrounding the fin(s) is formed over the substrate to support the fin(s).

Firstly, the substrate as shown in FIG. 7A is provided with one or more fins (407, 409) formed on the surface thereof. Herein, the fins themselves are semiconductor layers formed from a semiconductor material having a first conductivity type (e.g., lightly doped P-monocrystalline semiconductor or lightly doped N− monocrystalline semiconductor).

Figure 16:
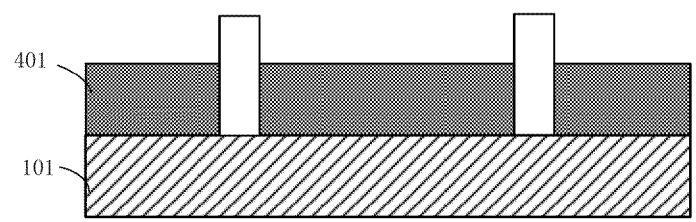

Next, an insulating material layer 1501 (hereafter also, the second insulating material layer) surrounding the fin 407 and 409 is formed over the substrate. After selective removal (e.g., CMP followed by back etch) and as shown in FIG. 16, the insulating material layer 401 has a predetermined thickness which is smaller than the height of the semiconductor layer. Thus, the gate and the dummy gate to be formed later will be formed over the insulating material layer.

Figure 15:
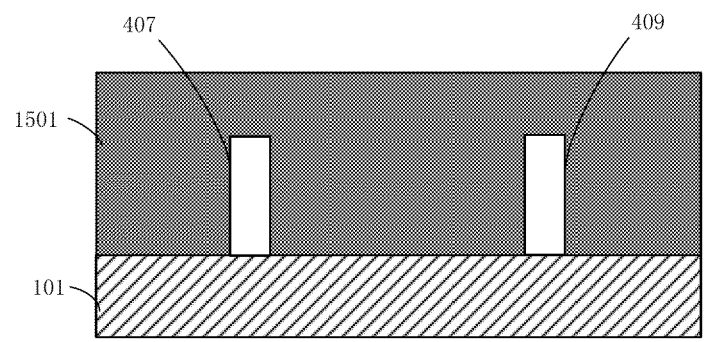
FIGS. 15-17, 18A and 18B, 19A and 19B, 20A and 20B, 21 and 22 are schematic cross-sectional views showing the steps of a method of manufacturing a semiconductor device according to another embodiment of the present disclosure.

More specifically and in one implementation of the present disclosure of invention, as shown in FIG. 15, a precursor second insulating material layer 1501 is formed over the substrate to fully cover the fins 407 and 409. The layer 101 represents a layer below and adjoining the fin. As described before, the layer 101 can be an insulating layer or a semiconductor layer. Fins 407 and 409 can have the first conductivity type, such as n-type or p-type. Although it is not shown in the figures, it should be understood that when the layer 101 is a semiconductor layer, the above-mentioned second channel control regions (for example, the above-mentioned first region and second region) can be formed in the layer 101 in advance.

Next, as shown in FIG. 16, the insulating material 1501 is controllably removed to a predetermined thickness (e.g., by way of CMP followed by etch back), wherein, the predetermined thickness is smaller than the height of the fin (the semiconductor layer). Thus, the insulating material layer 401 (the second insulating material layer) is formed. Note that, in this example, fins 407 and 409 themselves are semiconductor layers; however, in the case where the fin also has a hard mask layer, the height mentioned herein should refer to the height of the semiconductor layer (for example, 1070 and 1090, or the like) in the fin.

Here, the insulating material 1501 can be removed to the predetermined thickness through processes such as etching-back or the like. The predetermined thickness is smaller than the thickness of the semiconductor layer. As such, a portion of the semiconductor layer including its top end in the fin can be exposed.

In an embodiment, ratio of the thickness T of the insulating material layer 401 to the difference between the height Hsemi of the semiconductor layer 407 and the thickness T of the insulating material layer 401 (i.e. the height of the portion of the semiconductor layer in the fin which portion is exposed from the insulating material layer 401) is about 3-5, i.e. T/(Hsemi-T)=3-5.

Figure 17:
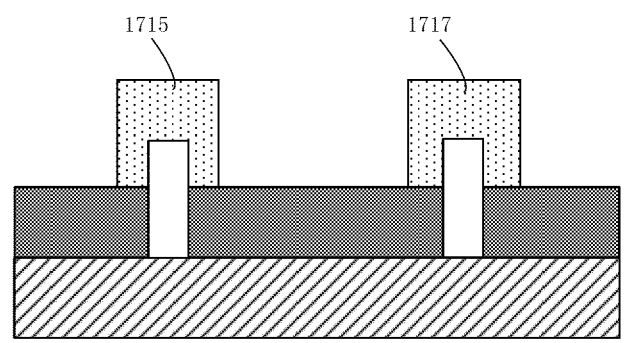

Then, as shown in FIG. 17, dummy gates 1715 and 1717 for the fins are formed over the insulating material layer 401 to enwrap the portions of the fin that are corresponding to the channel regions to be formed while not covering the source and drain portions (not shown in FIG. 17).

Figure 18A:
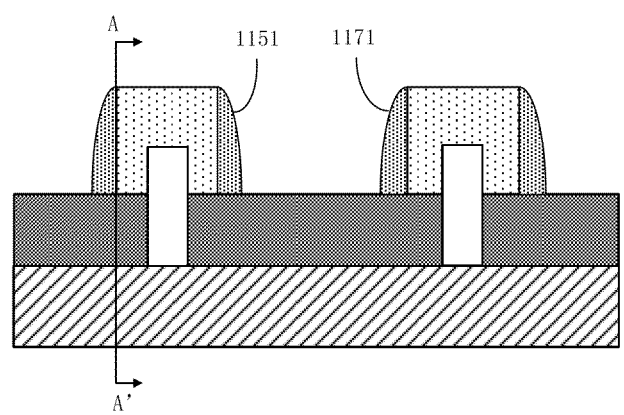
Figure 18B:
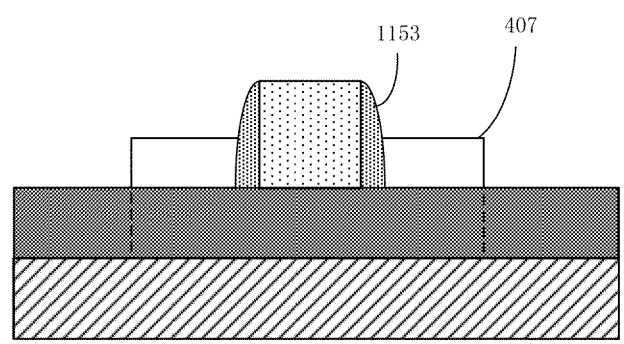

Next, in an embodiment, as shown in FIGS. 18A and 18B, respective spacers 1153 for framing each of the dummy gate are formed. Herein, FIG. 18B is a sectional view taken along line A-A' of FIG. 18A and viewed along the direction indicated by the arrow. The spacers 1153 are formed on two sides of the dummy gate that respectively adjoin the source region portion and the drain region portion to be formed later. While, on other sides of the dummy gate, sidewalls 1151 and 1171 can be formed correspondingly. The spacers 1153 are also formed over the second insulating material layer 401.

In an embodiment, a doping implantation can be performed at this stage for the exposed source and drain portions so as to form an appropriately doped source region portion and an appropriately doped drain region portion. However, the present teachings are not limited thereto.

Figure 19A:
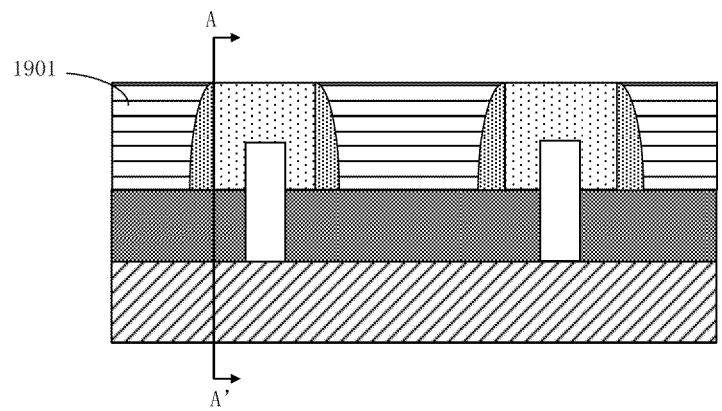
Figure 19B:
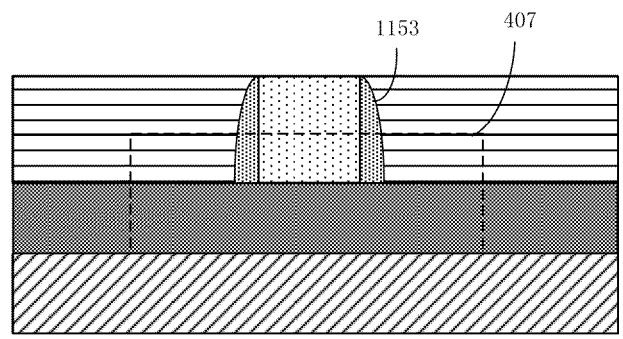

Thereafter, as shown in FIGS. 19A and 19B, an insulating material layer 1901 (the first insulating material layer) is formed, to at least cover the exposed portion of the fin and to expose the top of the dummy gate, and more preferably, to also cover the spacers (if present). In some preferred implementations, a first insulating material can be deposited onto the substrate on which the dummy gate (and spacers, if present) has already been formed, so as to cover the entire substrate; and then, chemical mechanical polishing (CMP) can be performed, thereby exposing the top of the dummy gate, or to say, such that the upper surface of the layer formed from the first insulating material is substantially flush (coplanar) with the upper surface of the dummy gate. The first insulating material can be composed for example of a silicon oxide.

Figure 20A:
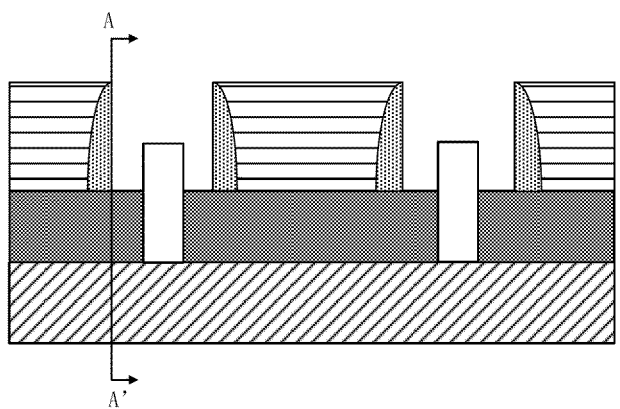
Figure 20B:
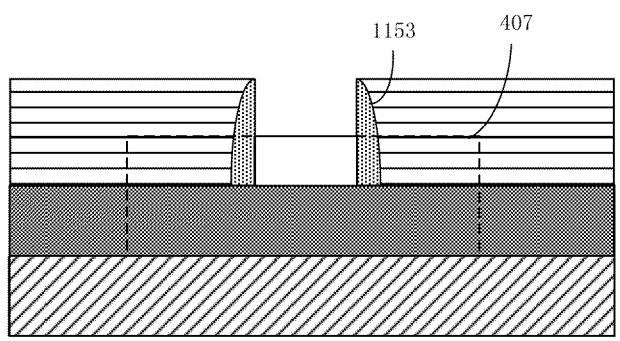

Next, as shown in FIGS. 20A and 20B, the dummy gates are removed to partially expose the semiconductor layers of the fins that were enwrapped by the dummy gates and continue to be anchored in the second insulating material layer 401. Herein, FIG. 20B is a sectional view taken along line A-A' of FIG. 20A and viewed along the direction indicated by the arrow.

Figure 21:
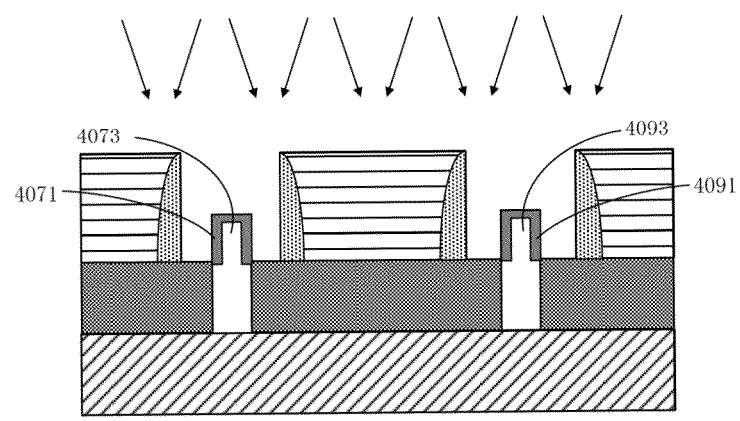

Thereafter, as shown in FIG. 21, one or more dopants that can impart a second conductivity type opposite to the first conductivity type is/are introduced into the fin (i.e. the exposed surface portions of the semiconductor layer), for example, by ion implantation, plasma treatment, diffusion, or the like. Thus, channel regions 4073 and 4093 as well as the channel control regions 4071 and 4091 for controlling the channel regions are formed in the fins 407 and 409. As for the structures of the channel regions (4073, 4093) and the channel control regions (4071, 4091), the related descriptions of FIG. 4A can be referred to.

Figure 22:
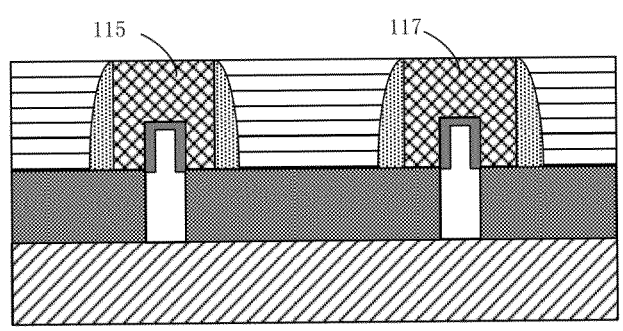

Thereafter, as shown in FIG. 22, the material for gates 115 and 117 is deposited and polished flush (e.g., by way of CMP followed by etch back) so as to form the gates 115 and 117 respectively adjoining their respective channel control regions from the outer side of the respective channel control regions.

Below, steps of the manufacturing method of a device according to another embodiment of the present invention are described with reference to FIGS. 23A-23B, 24A-24B, 25A-26B, 27 and 28, in which, this time and unlike the description immediately above, a substrate having a fin with a hard mask formed over the fin is employed.

Figure 23A:
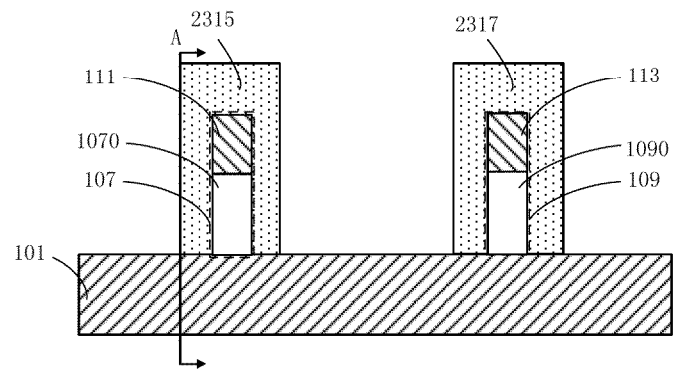
FIGS. 23A and 23B, 24A and 24B, 25A and 25B, 26A and 26B, 27 and 28 are schematic cross-sectional views showing the steps of a method of manufacturing a semiconductor device according to a still further embodiment of the present disclosure.
Figure 23B:
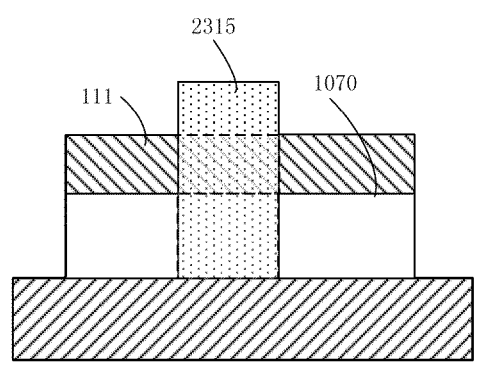

Firstly, as shown in FIGS. 23A and 23B, the layer 101 is formed with fins 107 and 109 thereon. Here, FIG. 23B is a sectional view taken along line A-A' of FIG. 23A and viewed along the direction indicated by the arrow. Fin 107 comprises a hard mask 111 and a semiconductor layer 1070 below the hard mask 111; and fin 109 comprises a hard mask 113 and a semiconductor layer 1090 below the hard mask 113.

Dummy (sacrificial) gates 2315 and 2317 for respective ones of the fins are formed over the substrate. FIG. 23B shows a view seen from the direction indicated by the arrow of FIG. 23A, wherein the dummy gate 2315 and the portion of the fin (including the hard mask 111 and the underlying semiconductor layer 1070) that is not enwrapped by the dummy gate are shown.

Figure 24A:
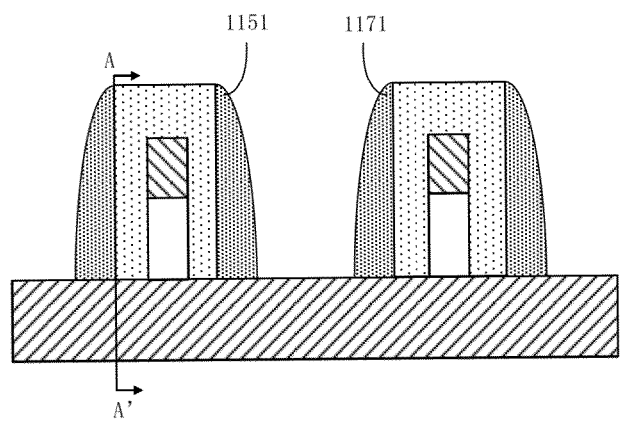
Figure 24B:
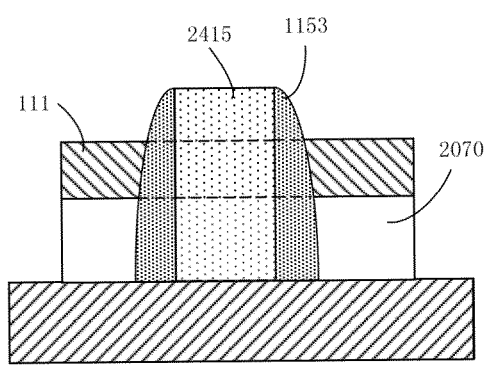

Thereafter, as shown in FIGS. 24A and 24B, spacers 1153 for the dummy gate are formed. Here, FIG. 24B is a sectional view taken along line A-A' of FIG. 24A and viewed along the direction indicated by the arrow. FIG. 24B more clearly shows the spacers 1153. The spacers 1153 are formed on the two sides of the dummy gate that adjoin the source region portion and the drain region portion to be formed later. While, as shown in FIG. 24A, sidewalls 1151 and 1171 are formed on other sides of the dummy gate at the same time.

In an embodiment, source region portion and drain region portion (not shown in the figure) can be formed herein in a self-aligned manner by, for example, tilt implant and/or diffusion doping around edges of the overlying hard mask 111.

Figure 25A:
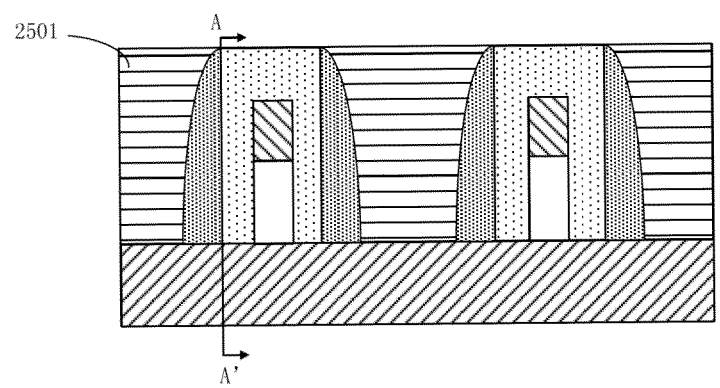
Figure 25B:
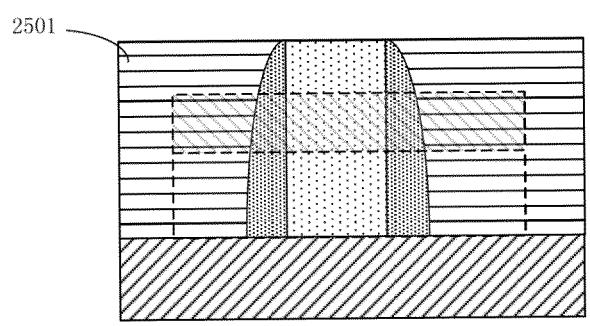

Then, as shown in FIGS. 25A and 25B, an insulating material layer 2501 is formed to at least cover the exposed portion of the fin and to expose the top of the dummy gate. In an embodiment, the insulating material layer 2501 also covers the spacers 1153. Herein, FIG. 25B is a sectional view taken along line A-A' of FIG. 25A and viewed along the direction indicated by the arrow.

Figure 26A:
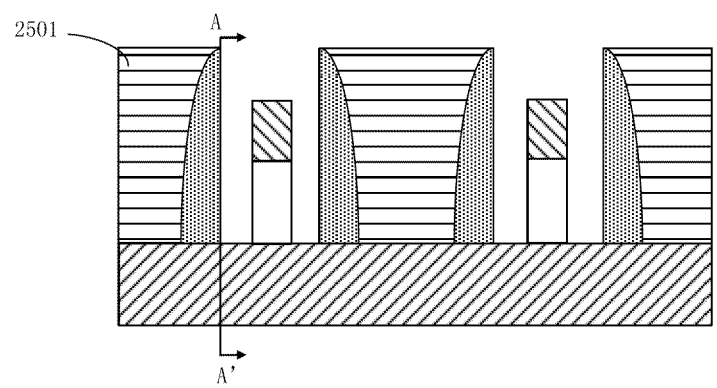
Figure 26B:
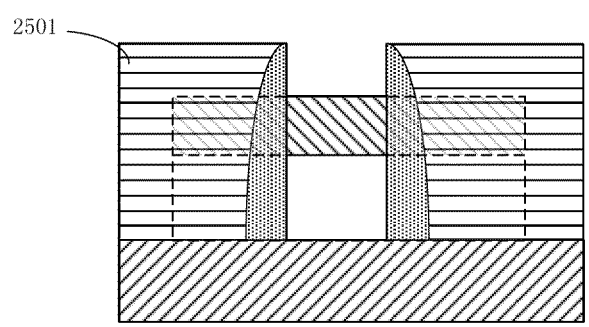

Next, as shown in FIGS. 26A and 26B, the dummy gates are selectively removed to expose the semiconductor layers of the fins that were enwrapped by the dummy gates. Herein, FIG. 26B is a sectional view taken along line A-A' of FIG. 26A and viewed along the direction indicated by the arrow.

Figure 27:
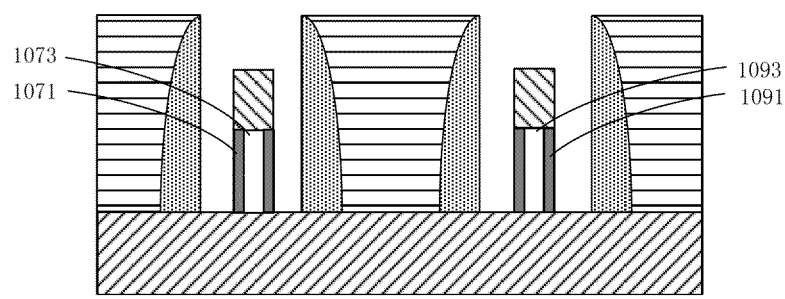

Thereafter, as shown in FIG. 27, a dopant that can impart a second conductivity type opposite to the first conductivity type is introduced into the fin (i.e. the semiconductor layer in the fin), for example, by tilted ion implantation, plasma treatment, diffusion, or the like. Thus, channel regions 1073 and 1093 as well as channel control regions 1071 and 1091 for controlling the channel regions are formed in the fins 1070 and 1090. As for the structures of the channel regions (1073, 1093) and the channel control regions (1071, 1091), the relevant descriptions of FIG. 1 can be referred to.

Likewise, in the case where the semiconductor layers 1070 and 1090 having different conductivity types, that is to say, in the case where the channel regions to be formed in the semiconductor layers 1070 and 1090 have different conductivity types, their respective introductions of dopant can be performed separately. For example, the first fin can be covered by a mask (e.g., a resist) while dopant is introduced into the second fin; vice versa.

Figure 28:
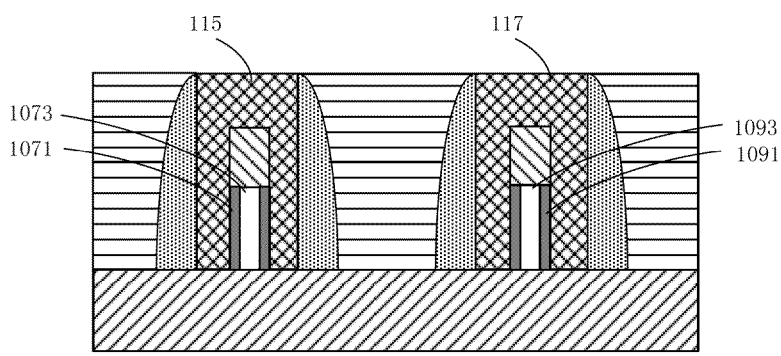

Thereafter, as shown in FIG. 28, corresponding gates 115 and 117 are formed.

Those skilled in the art would understand that the method of this embodiment can be combined with the method described above in conjunction with FIGS. 18A-22, to form the device as shown in FIGS. 3A and 3B.

In addition, those skilled in the art would understand in view of the foregoing that although the gate-last manufacturing method has been mainly described in the present disclosure of invention, the present teachings are not limited to this. For example, there could exist such a case where after forming the dummy gate and before forming the gate, spacer and source/drain are not formed. Instead, the first insulating material layer can be removed after the introduction of the dopant; thereafter, gate is formed; and after the formation of the gate, spacers and the source/drain portions are formed.

It should also be understood that in the case where the first fin and the second fin have different conductivity types of channel regions, their respective introductions of dopants can be performed separately. For example, the first fin can be covered by a mask (e.g., a resist) while dopant is introduced into the second fin; and vice versa. As described before, in the present application, minor steps, components or details which are not concerned by the basic concepts of the present teachings and which are known by those skilled in the art, or can be apparently conceived based on the above teachings, have not been described in detail.

While various embodiments in accordance with the present disclosure of invention have been described above with reference to the drawings, it should be appreciated, however, that these embodiments are merely illustrative in nature and are not intended to limit the teachings of this application. For example, the embodiments can be arbitrarily combined whether other features without materially departing from the spirit of the present teachings. For example, the present invention can not only be applicable to the advanced semiconductor logic device processes, but can also adaptively be applied to various other miniaturized processes. In addition, the embodiments and details of the present disclosure of invention can be modified by one skilled in the related art in light of the teachings provided herein without departing from such teachings. Therefore, all these modifications are within the spirit and scope of the present teachings.

What is claimed is:

1. A method of manufacturing a semiconductor device, comprising:
    providing a substrate;
    providing a fin protruding upwardly from or through a surface of the substrate, the fin having a first semiconductor layer portion formed of a corresponding first semiconductive material having a respective first conductivity type, the first semiconductor layer portion of the fin not including semiconductive material of a second conductivity type that is opposite to that of the first conductivity type;
    forming a to-be-sacrificed dummy gate enwrapping just a first portion of the fin that corresponds to a channel region to be formed at that enwrapped first portion;
    forming a first insulating material layer so as to at least cover an exposed second portion of the fin that is not enwrapped by the dummy gate, the formed first insulating material layer leaving exposed a top surface of the dummy gate;
    selectively removing the dummy gate to thereby expose the first portion of the first semiconductor layer portion that was enwrapped by the dummy gate while not exposing the second portion of the fin that is covered by the first insulating material layer; and
    introducing, into the exposed portion of the first semiconductor layer portion, one or more dopants including a conductivity type reversing dopant that is capable of imparting the second conductivity type to the semiconductive parts of the fin it is introduced into, so as to thereby form a channel region having the first conductivity type and at least two opposed channel control regions having the second conductivity type, the at least two opposed channel control regions being disposed for selectively generating charge depletion zones at and into opposed sides of the channel region for thereby selectively controlling current conduction through the channel region.

2. The method of claim 1, wherein the fin further comprises a hard mask portion disposed over the first semiconductor layer portion.

3. The method of claim 1 further comprising:
    after forming the dummy gate but before forming the first insulating material layer, forming gate spacers disposed for keeping the dummy gate spaced apart from source and drain regions of the to be formed JFET device, and
    wherein the formed first insulating material layer also substantially covers the gate spacers.

4. The method of claim 3 and further comprising:
    after forming the gate spacers but before forming the first insulating material layer, epitaxially growing a semiconductor material from the exposed portion of the first semiconductor layer, and
    wherein the formed first insulating material layer also substantially covers the epitaxially grown semiconductor material.

5. The method of claim 3 further comprising:
    after forming the gate spacers, epitaxially growing a semiconductor material from exposed portions of the first semiconductor layer.

6. The method of claim 3 further comprising:
    introducing one or more dopants to thereby form a source region and a drain region that adjoin the channel region, the source region and the drain region having a same conductivity type as that of the channel region.

7. The method of claim 1 further comprising:
    before forming the dummy gate, forming, over the substrate, a second insulating material layer that surrounds the fin, the second insulating material layer having a predetermined thickness smaller than a height of the first semiconductor layer portion such that the gate and the dummy gate can be formed above the second insulating material layer.

8. The method of claim 1, wherein the substrate further comprises a second semiconductor layer disposed below and adjoining the fin, the second semiconductor layer having a second channel control region formed therein for generating a current charge depletion zone from below and into the fin, wherein the second channel control region has a conductivity type which is opposite to that of the channel region.

9. The method of claim 1, wherein the substrate comprises two or more of the fins formed thereon, the two or more of the fins comprise a first fin and a second fin, the conductivity type of the channel region included in the first fin is opposite to the conductivity type of the channel region included in the second fin.

* * * * *